(12) United States Patent
Song et al.

(10) Patent No.: US 11,335,680 B2
(45) Date of Patent: May 17, 2022

(54) INTEGRATED CIRCUITS AND METHOD OF MANUFACTURING THE SAME

(71) Applicant: Samsung Electronics Co., Ltd., Suwon-si (KR)

(72) Inventors: Jaeyeol Song, Seoul (KR); Seungha Oh, Seoul (KR); Rakhwan Kim, Suwon-si (KR); Minjung Park, Seoul (KR); Dongsoo Lee, Gunpo-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/912,427

(22) Filed: Jun. 25, 2020

(65) Prior Publication Data
US 2021/0151432 A1 May 20, 2021

(30) Foreign Application Priority Data
Nov. 15, 2019 (KR) .................. 10-2019-0146961

(51) Int. Cl.
*H01L 27/088* (2006.01)
*H01L 29/78* (2006.01)
*H01L 29/51* (2006.01)
*H01L 21/8234* (2006.01)
*H01L 29/66* (2006.01)

(52) U.S. Cl.
CPC .. *H01L 27/0886* (2013.01); *H01L 21/823431* (2013.01); *H01L 21/823462* (2013.01); *H01L 29/517* (2013.01); *H01L 29/66795* (2013.01); *H01L 29/785* (2013.01)

(58) Field of Classification Search
CPC ............ H01L 27/0886; H01L 27/0924; H01L 21/823431; H01L 29/66795; H01L 29/785; H01L 29/4966; H01L 29/4958; H01L 21/28079; H01L 21/28088; H01L 29/517
See application file for complete search history.

(56) References Cited

U.S. PATENT DOCUMENTS 9,620,610 B1  4/2017  Jangjian et al.
10,461,167 B2  10/2019  Lee et al.
(Continued)

FOREIGN PATENT DOCUMENTS

KR  10-2019-0000965  1/2019

*Primary Examiner* — Tuan A Hoang
(74) *Attorney, Agent, or Firm* — Myers Bigel, P.A.

(57) ABSTRACT

An integrated circuit (IC) device includes first and second fin-type semiconductor active regions on a substrate. A plurality of first semiconductor patterns are provided, which are stacked on the first fin-type active region as a first plurality of spaced-apart channel regions of a first FINFET. A plurality of second semiconductor patterns are provided, which are stacked on the second fin-type active region as a second plurality of spaced-apart channel regions of a second FINFET. A first gate structure is provided on the plurality of first semiconductor patterns. This first gate structure includes a first material region, which at least partially fills spaces between the first plurality of spaced-apart channel regions. A second gate structure is also provided on the plurality of second semiconductor patterns. The second gate structure includes second and third material regions, which at least partially fill spaces between the second plurality of spaced-apart channel regions.

18 Claims, 32 Drawing Sheets

(56) References Cited

U.S. PATENT DOCUMENTS

| | | | |
|---|---|---|---|
| 2014/0091360 A1* | 4/2014 | Pillarisetty | H01L 29/775 257/190 |
| 2016/0254261 A1* | 9/2016 | Machkaoutsan | H01L 27/0924 257/369 |
| 2016/0358921 A1* | 12/2016 | Park | H01L 21/823842 |
| 2017/0125298 A1* | 5/2017 | Jangjian | H01L 21/28088 |
| 2018/0315667 A1 | 11/2018 | Kwon et al. | |
| 2019/0122937 A1* | 4/2019 | Cheng | H01L 29/42376 |
| 2019/0131394 A1 | 5/2019 | Reznicek et al. | |
| 2019/0131396 A1 | 5/2019 | Zhang et al. | |
| 2019/0165113 A1* | 5/2019 | Lin | H01L 29/66795 |
| 2020/0273710 A1* | 8/2020 | Zhang | H01L 29/6653 |

* cited by examiner

FIG. 2A
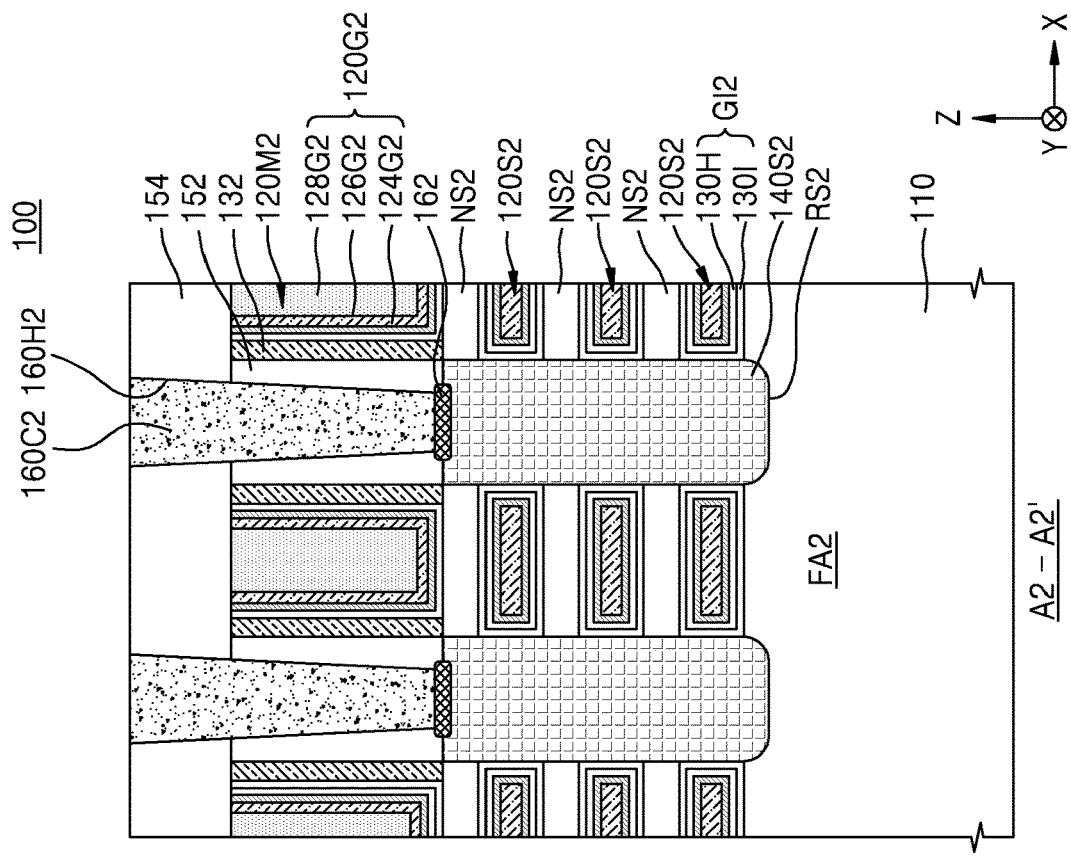
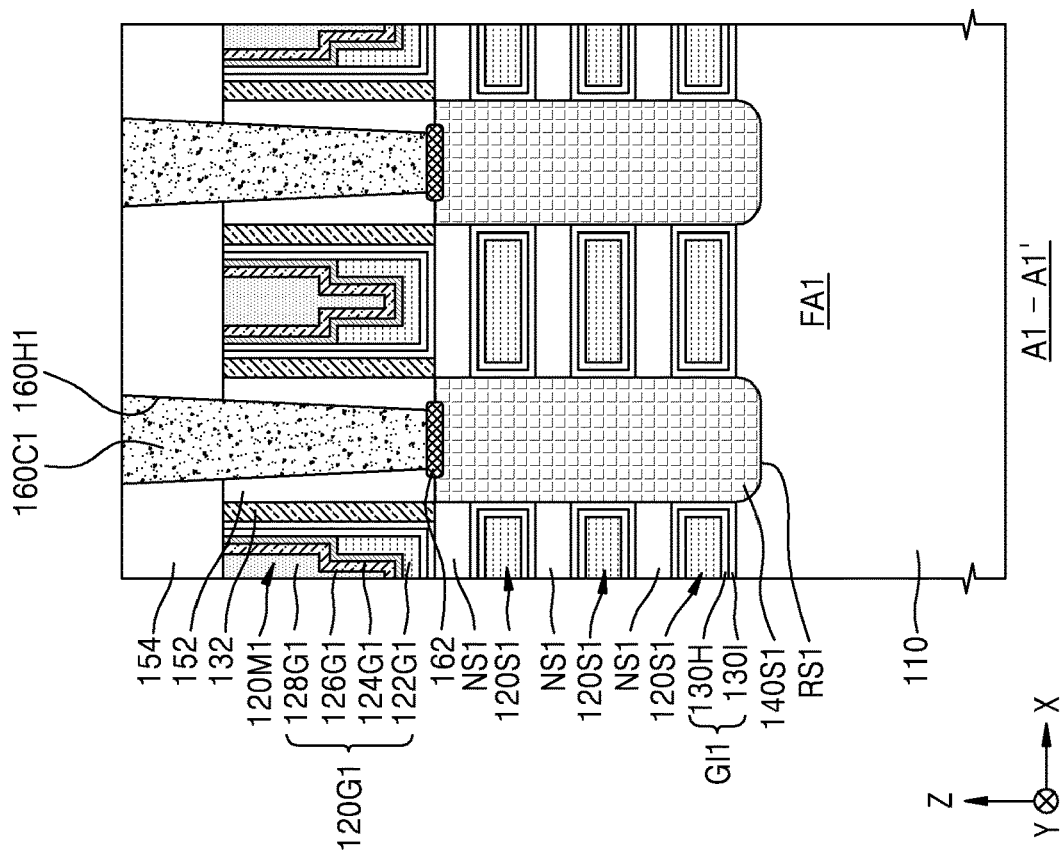

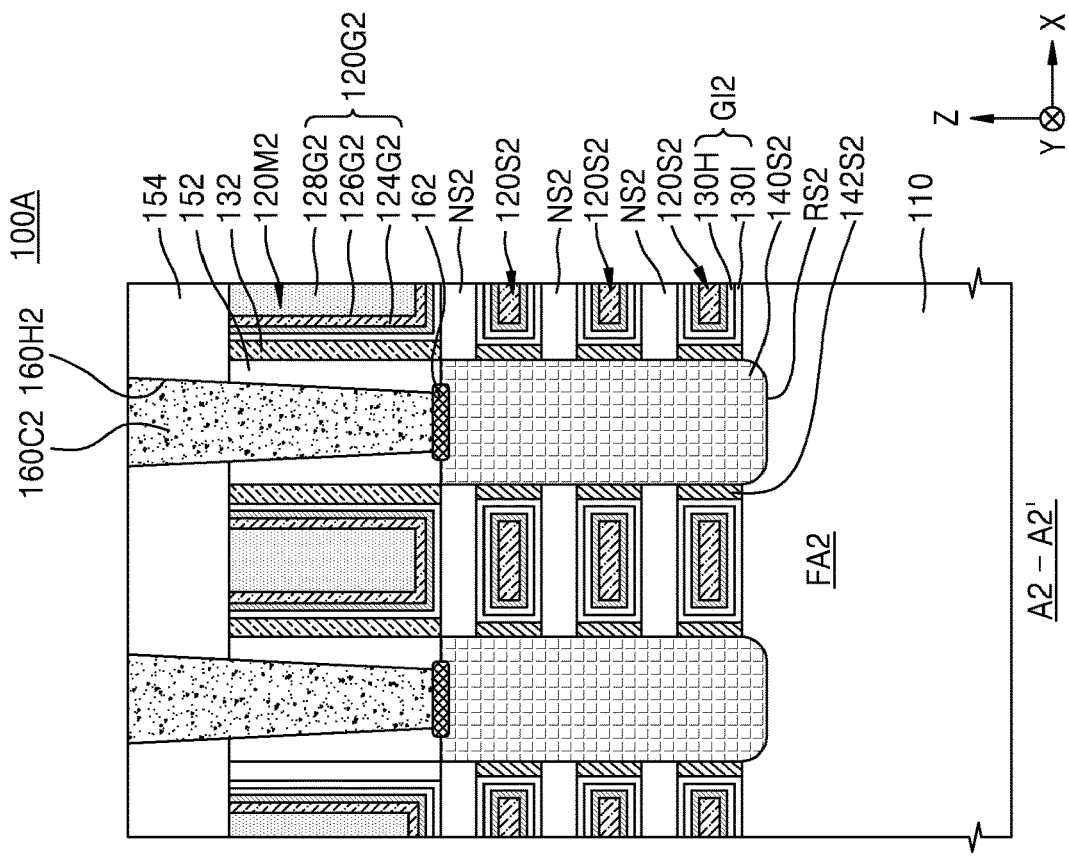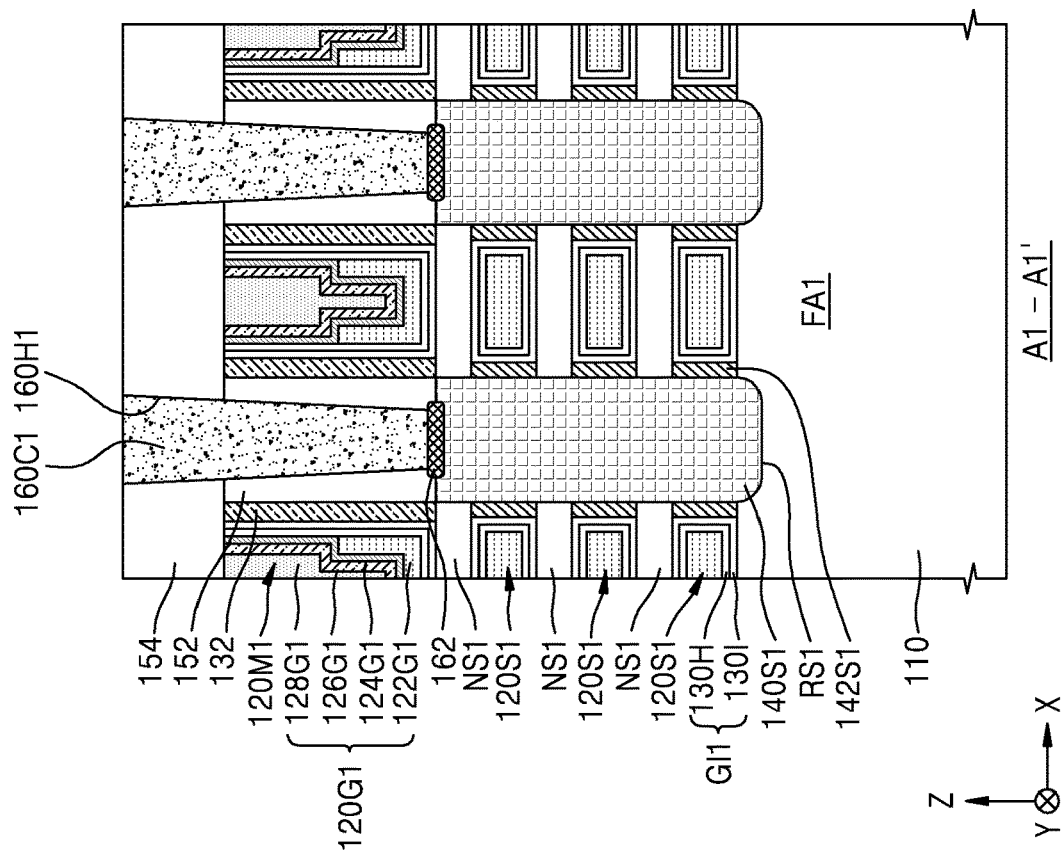
FIG. 3A

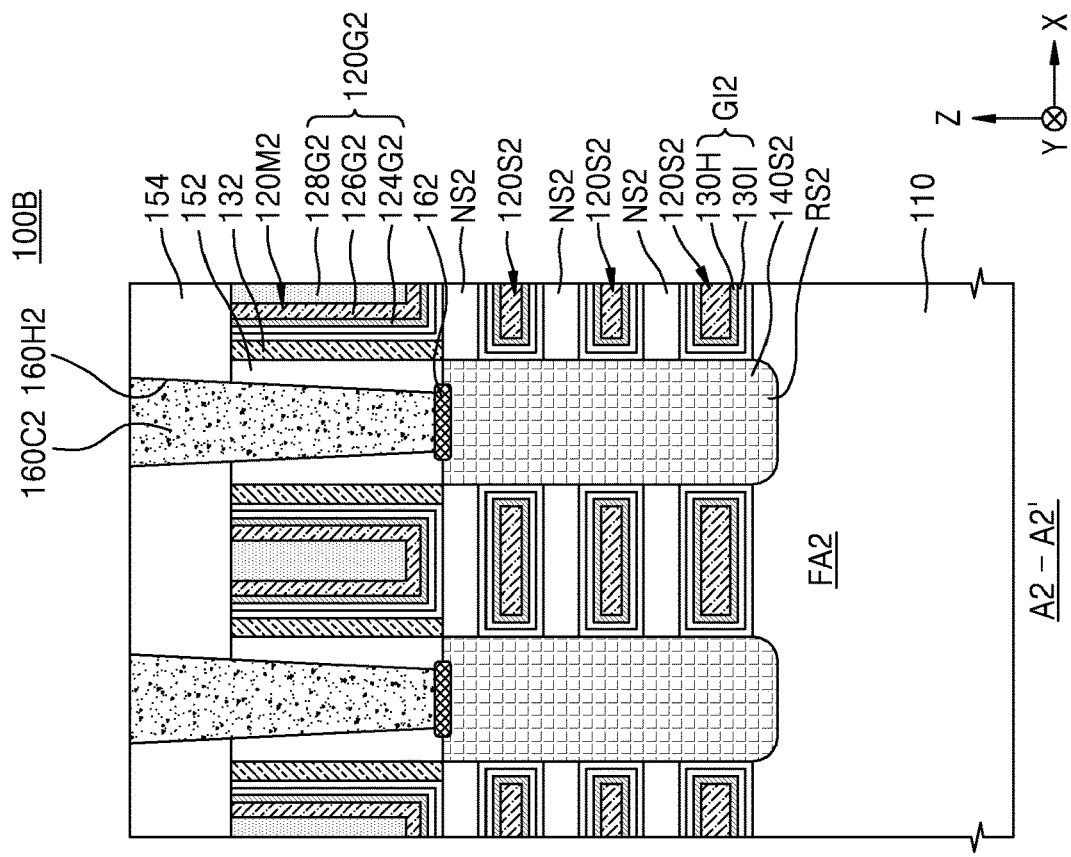
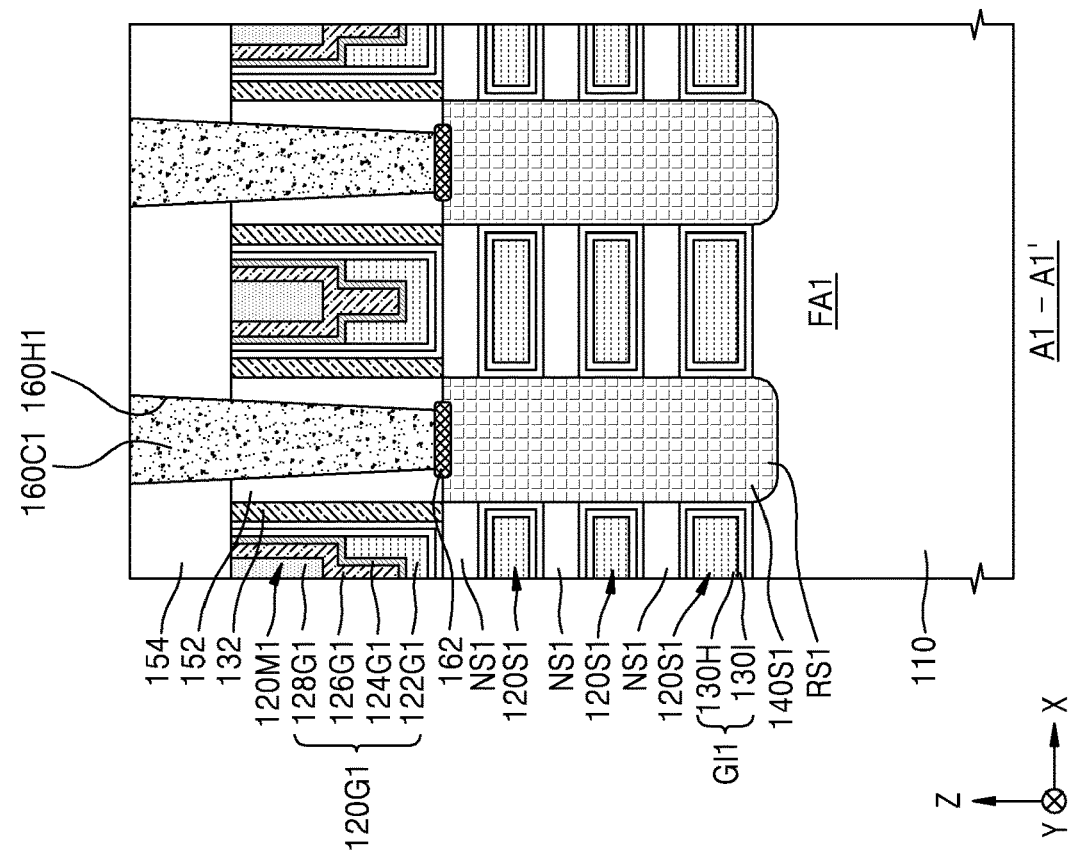
FIG. 4A

FIG. 5A
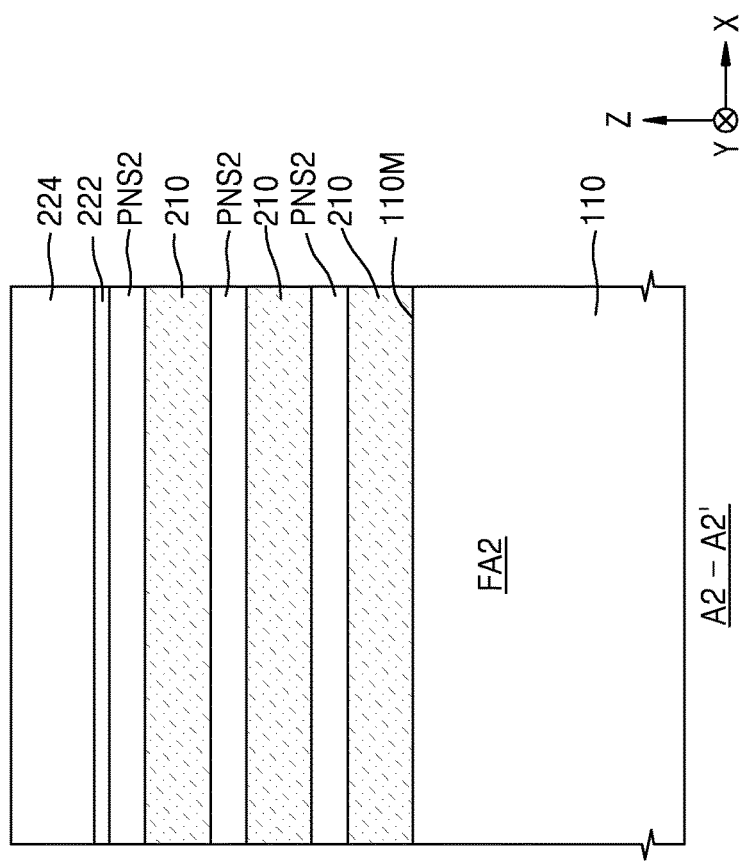
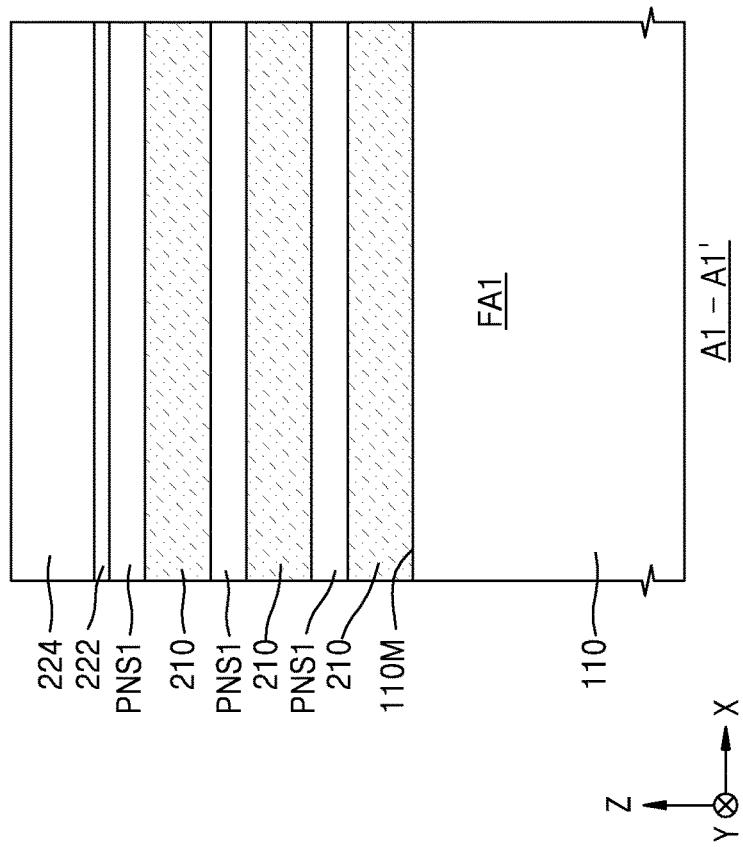

FIG. 6A
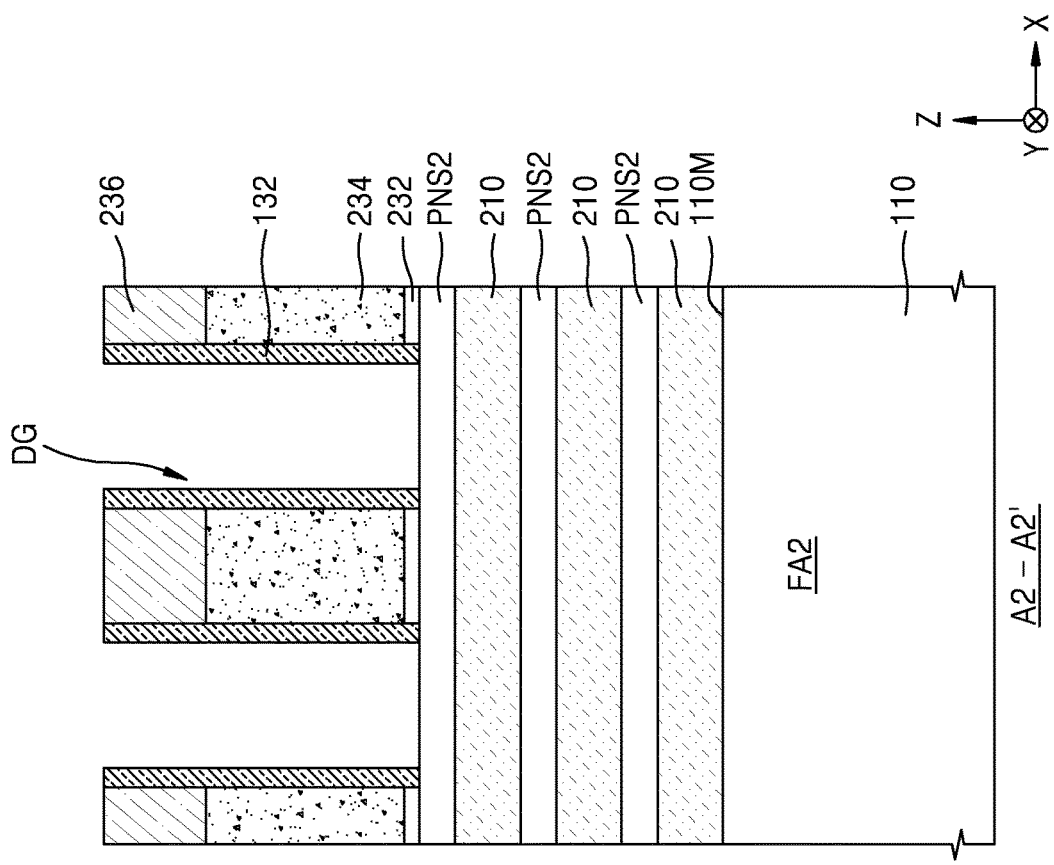
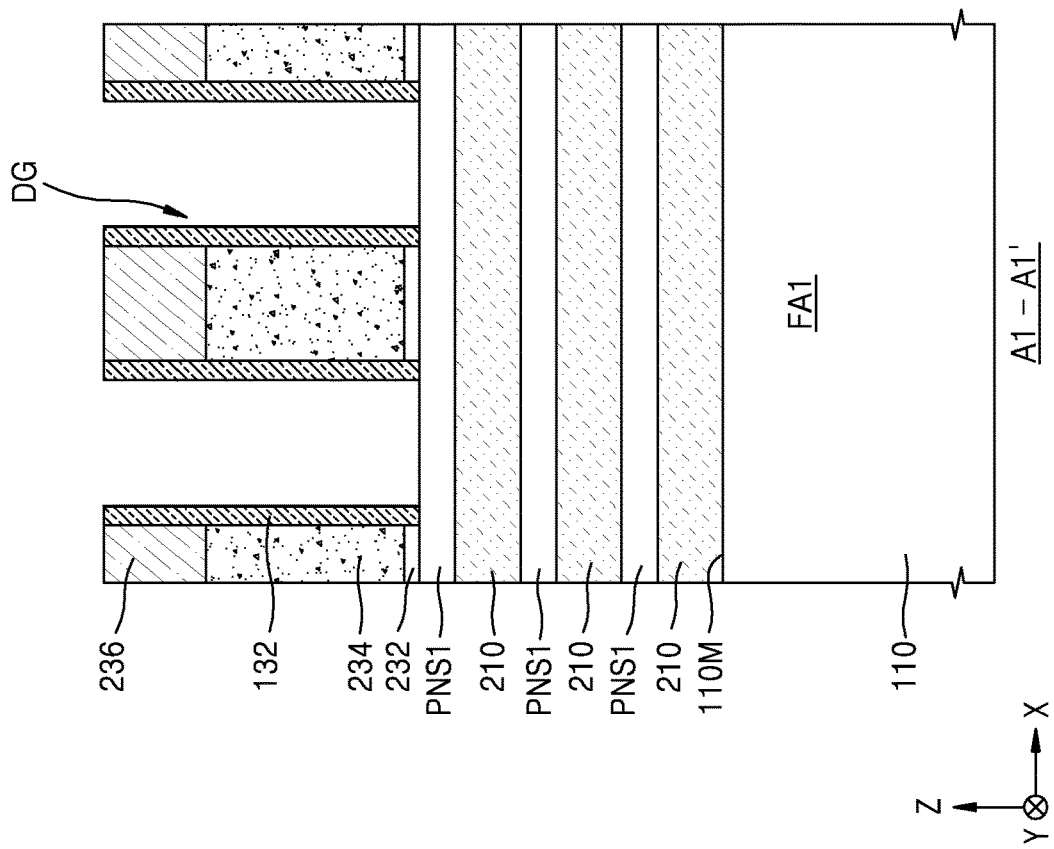

FIG. 6B
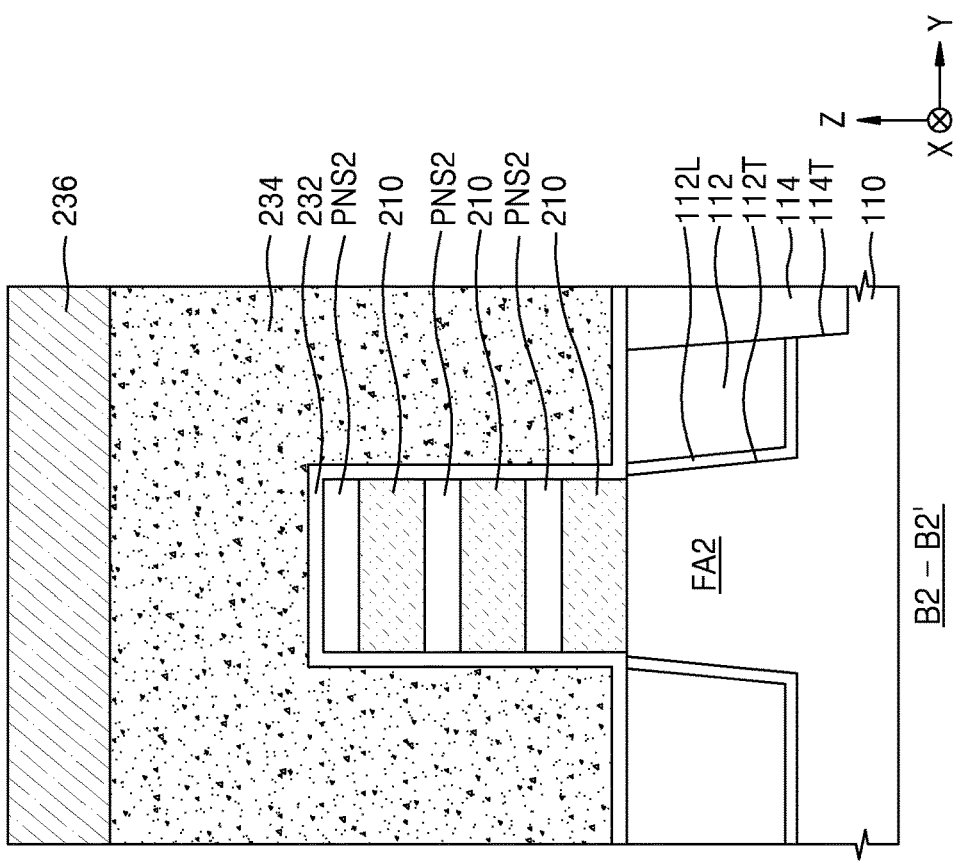
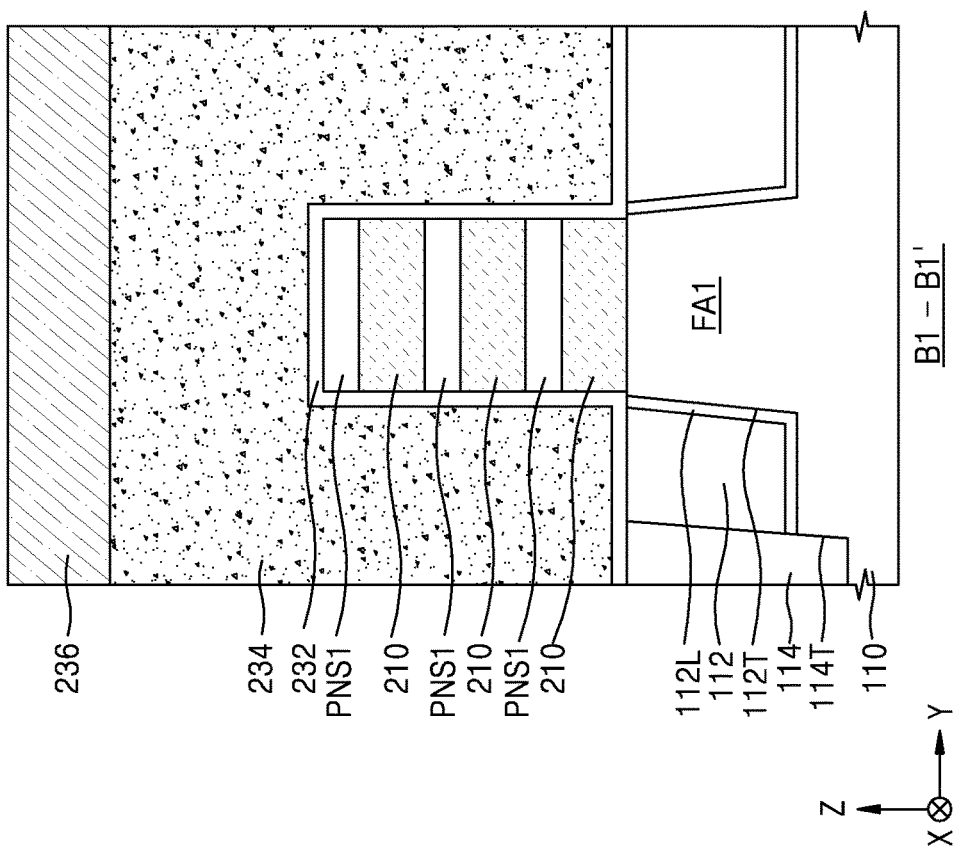

FIG. 8
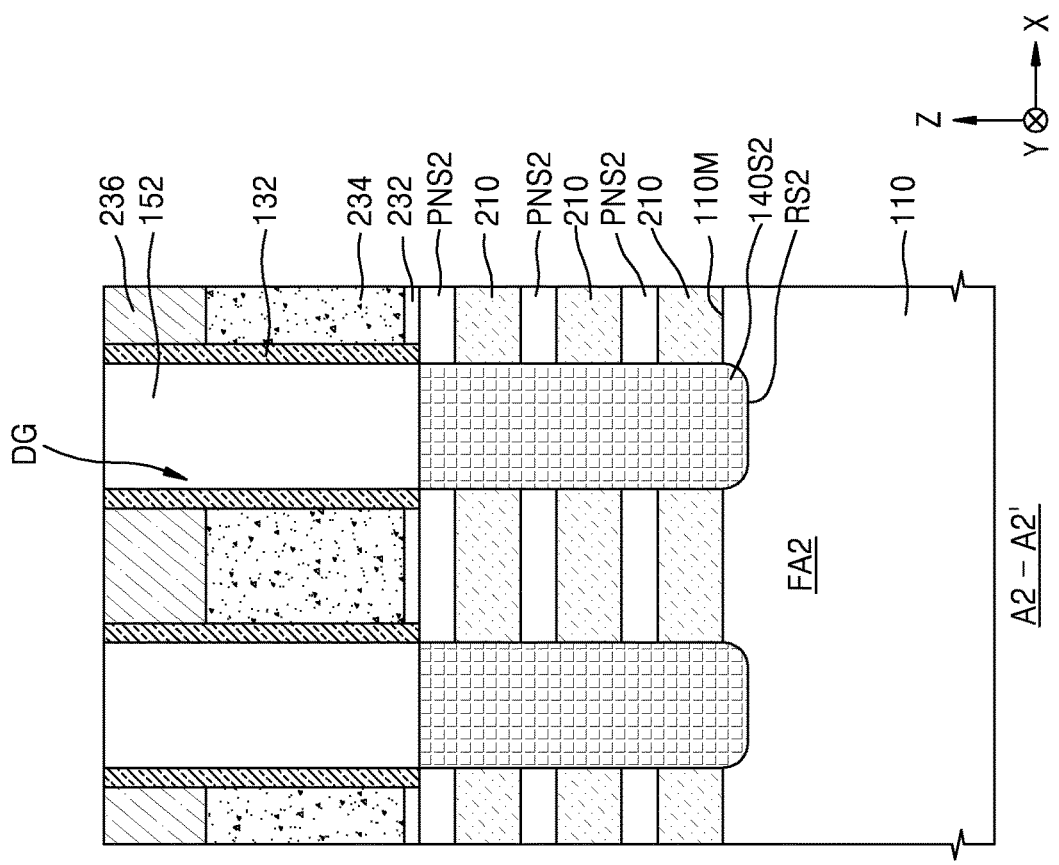
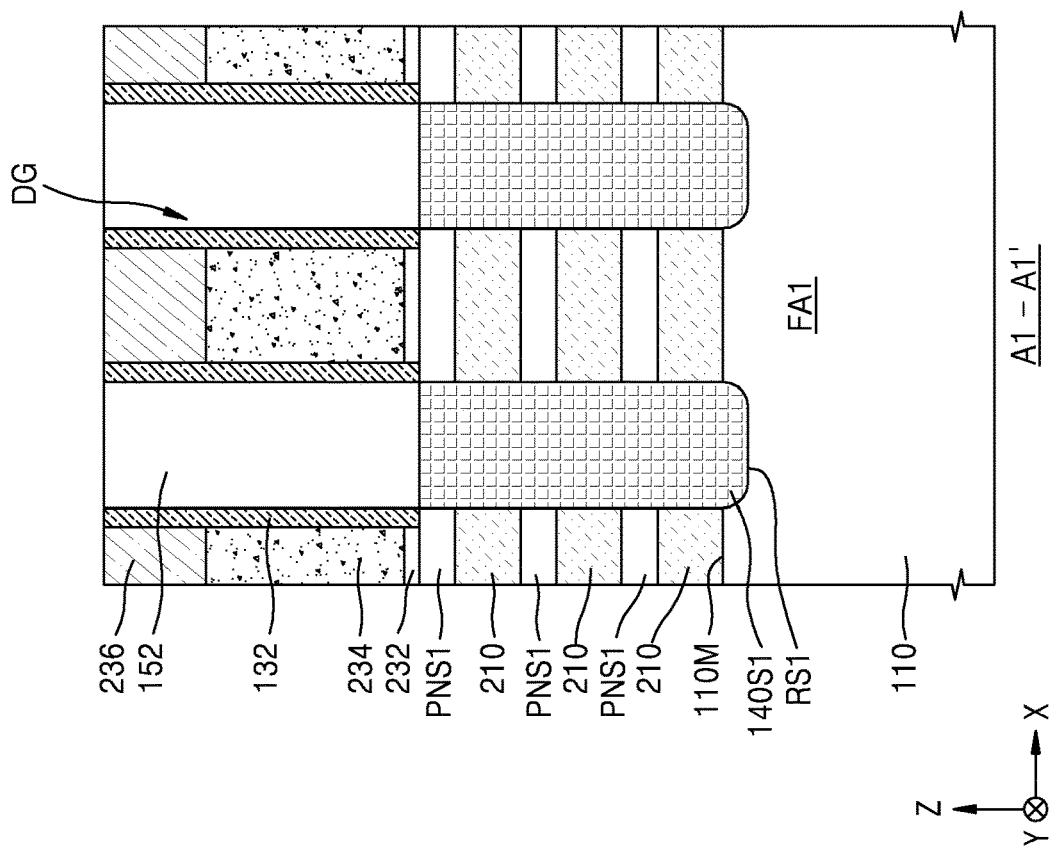

FIG. 9A
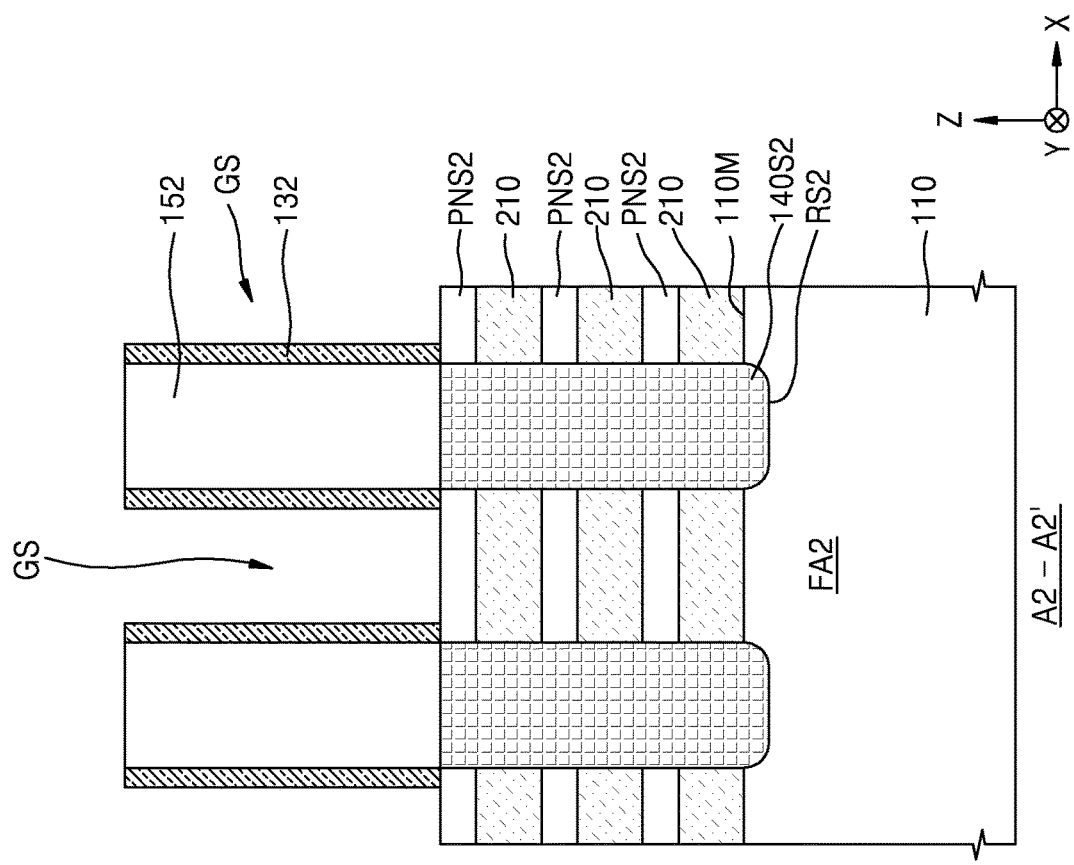
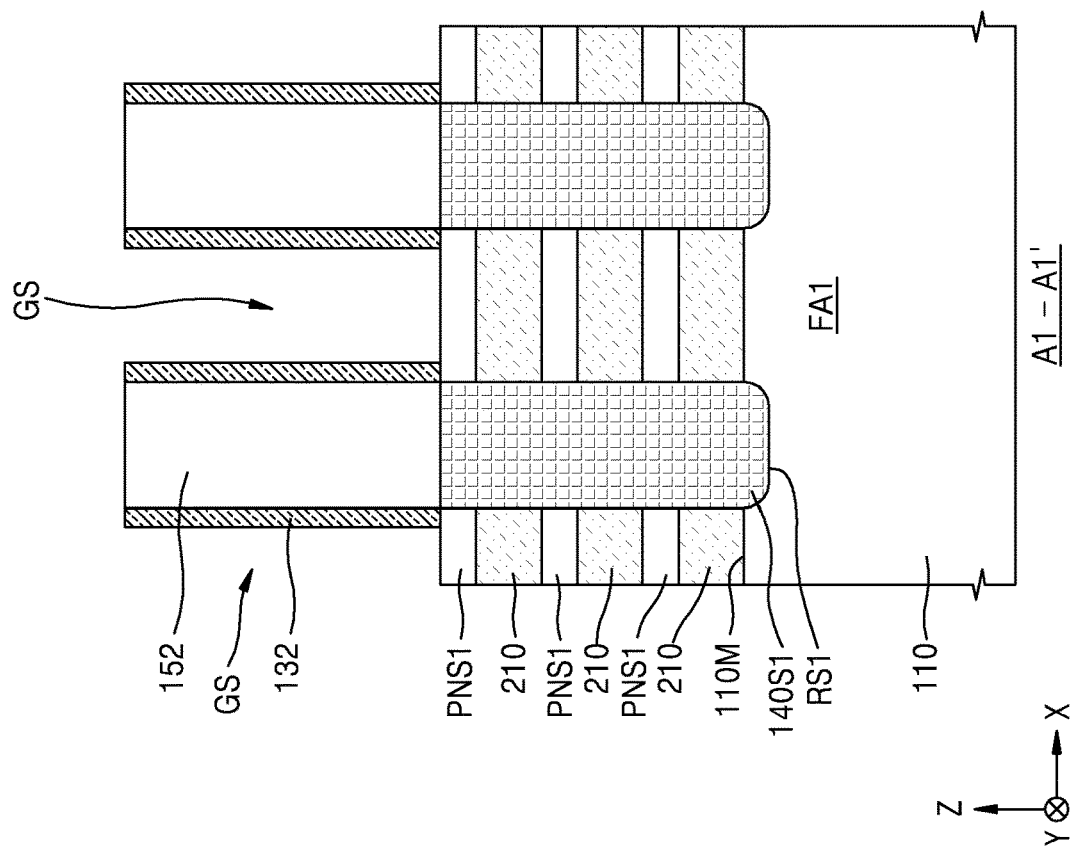

FIG. 9B
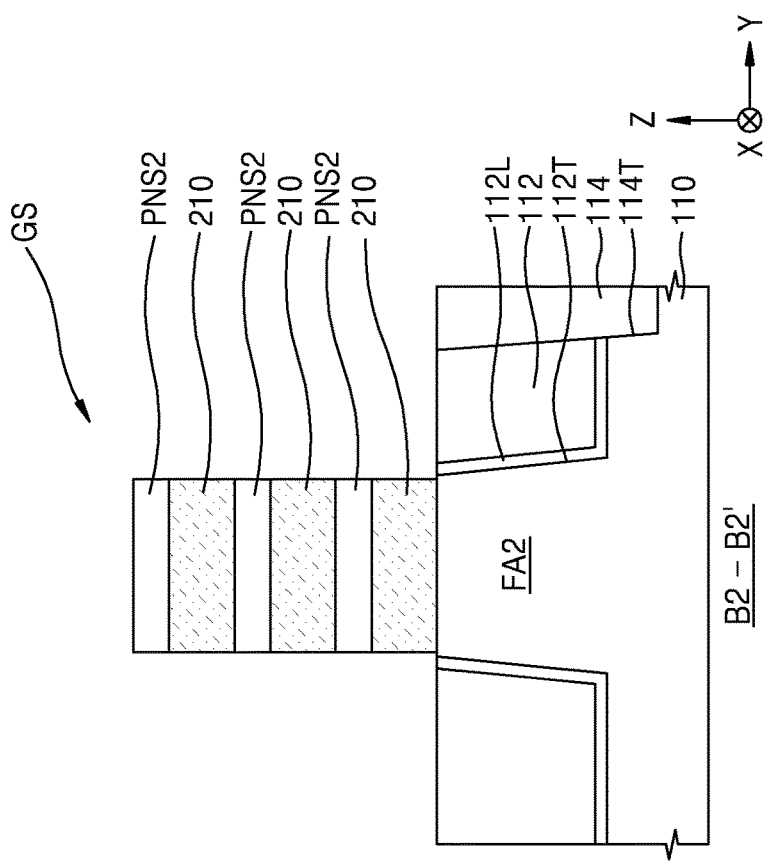
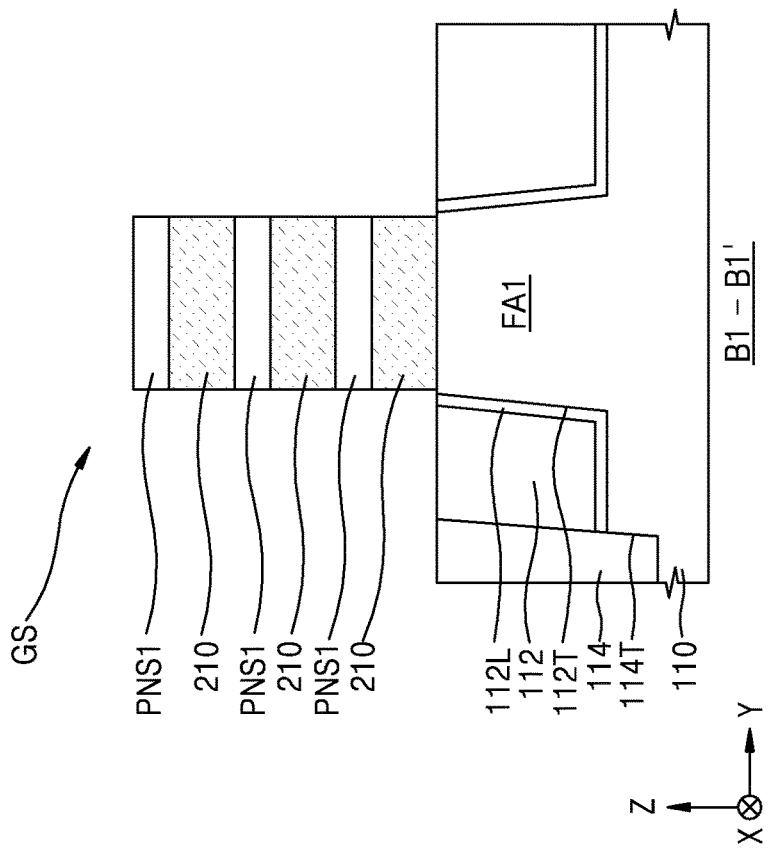

FIG. 10A
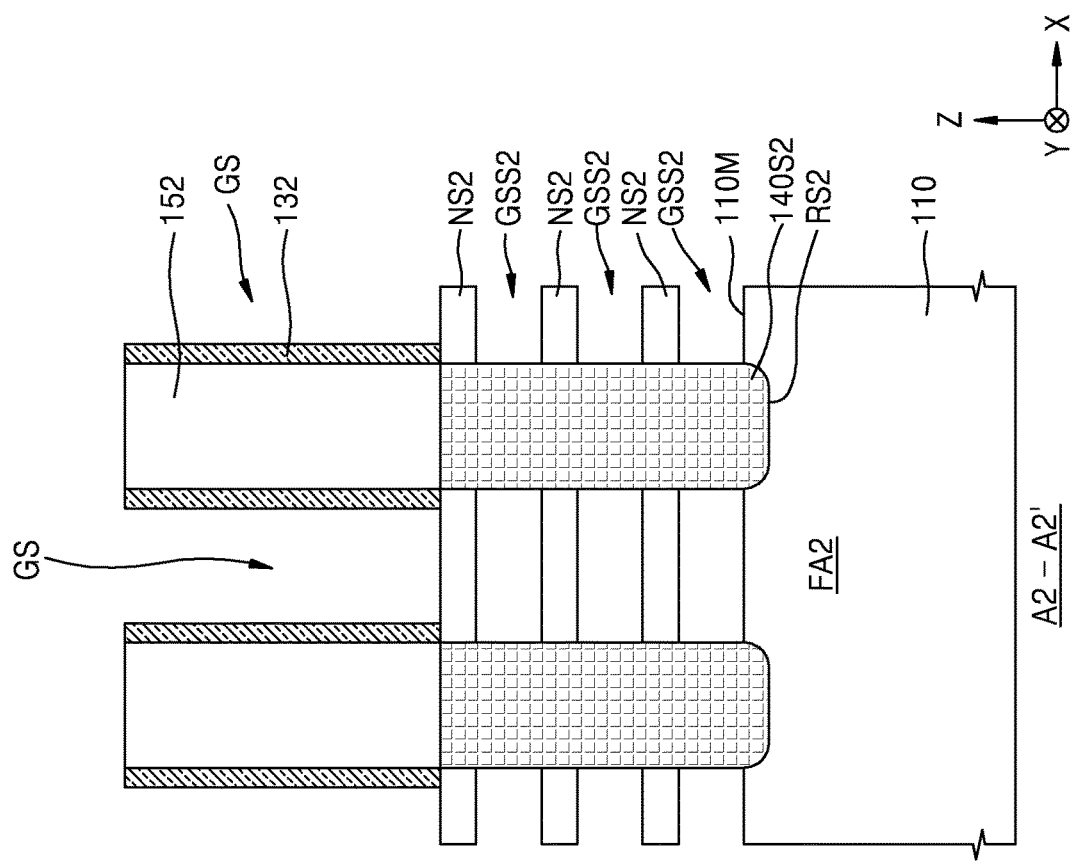
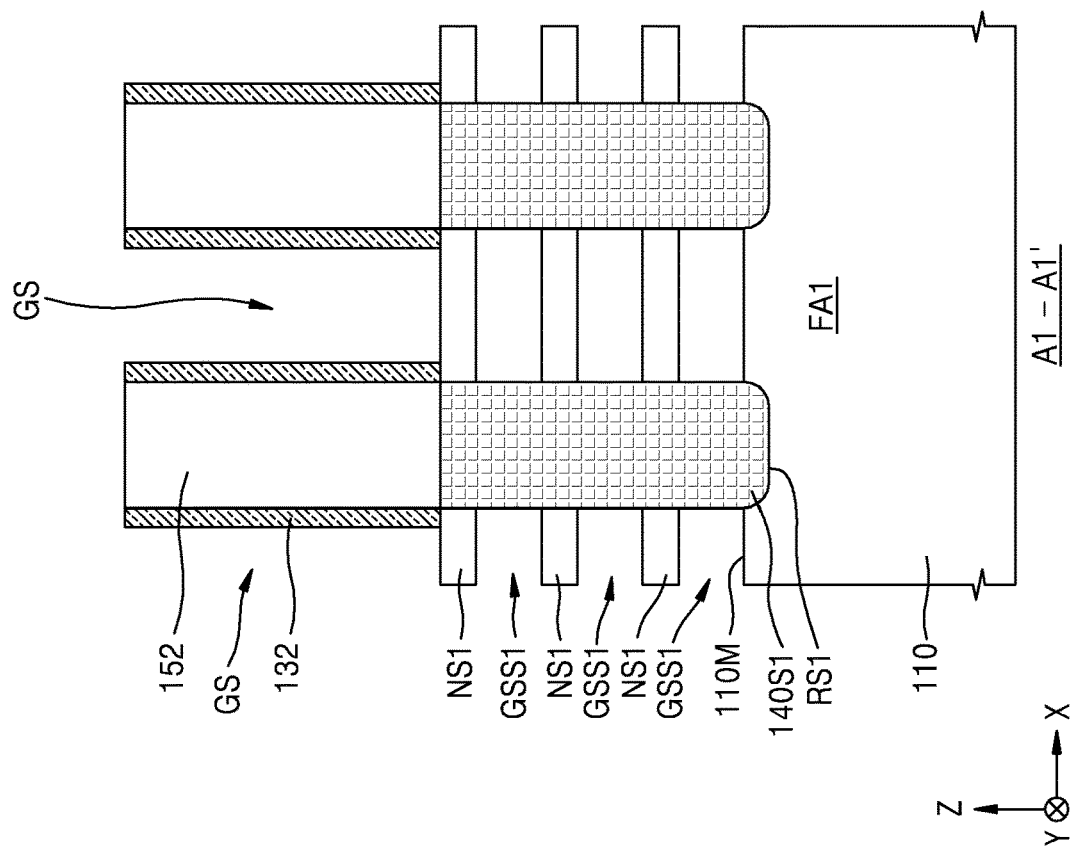

FIG. 11A
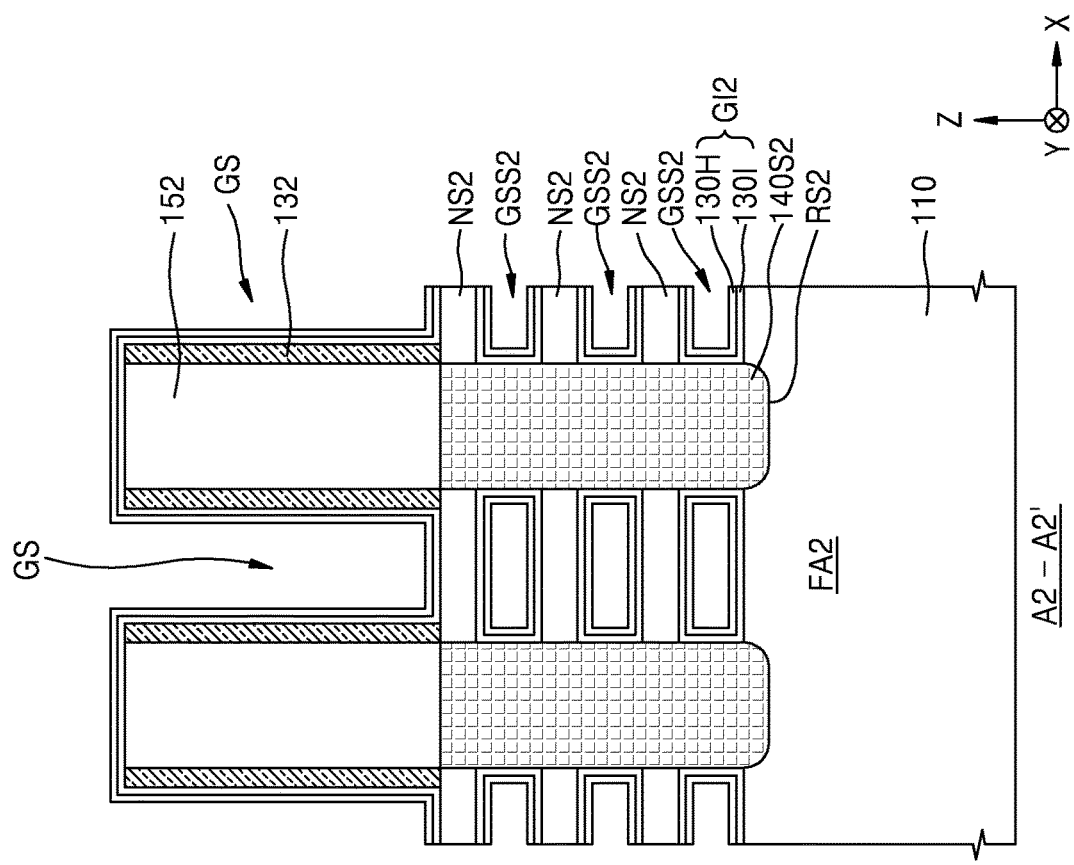
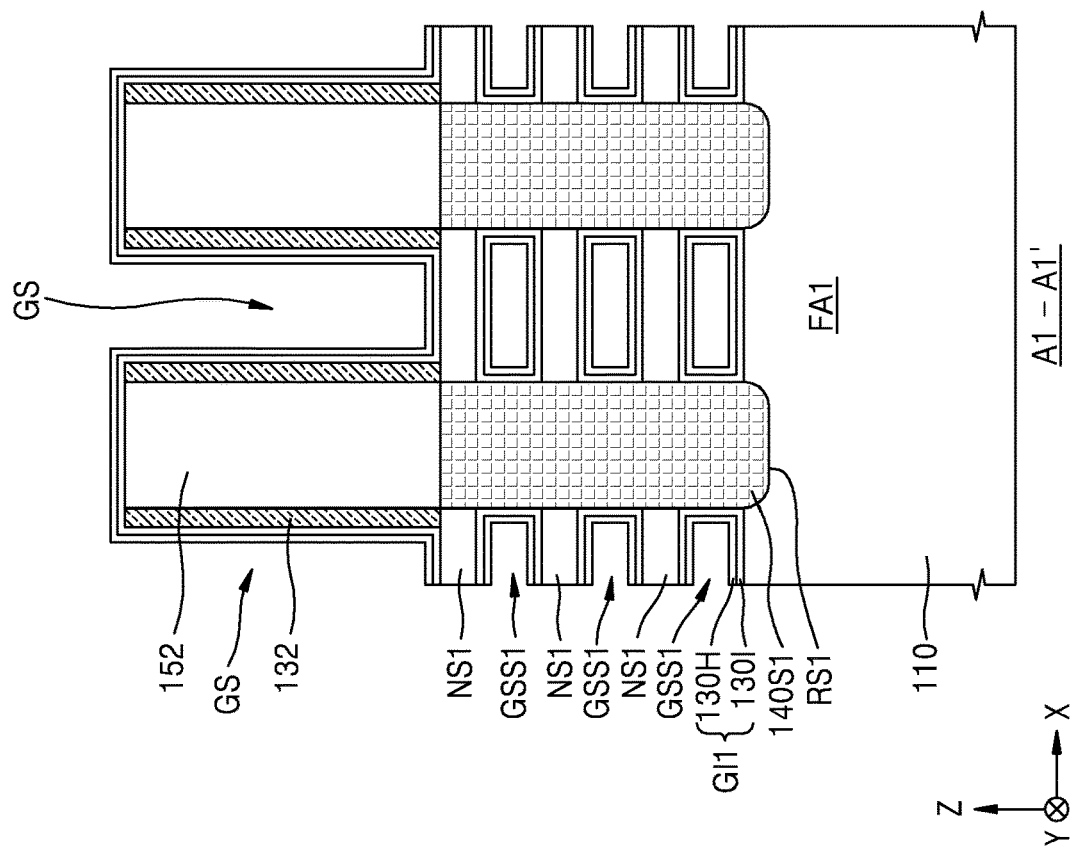

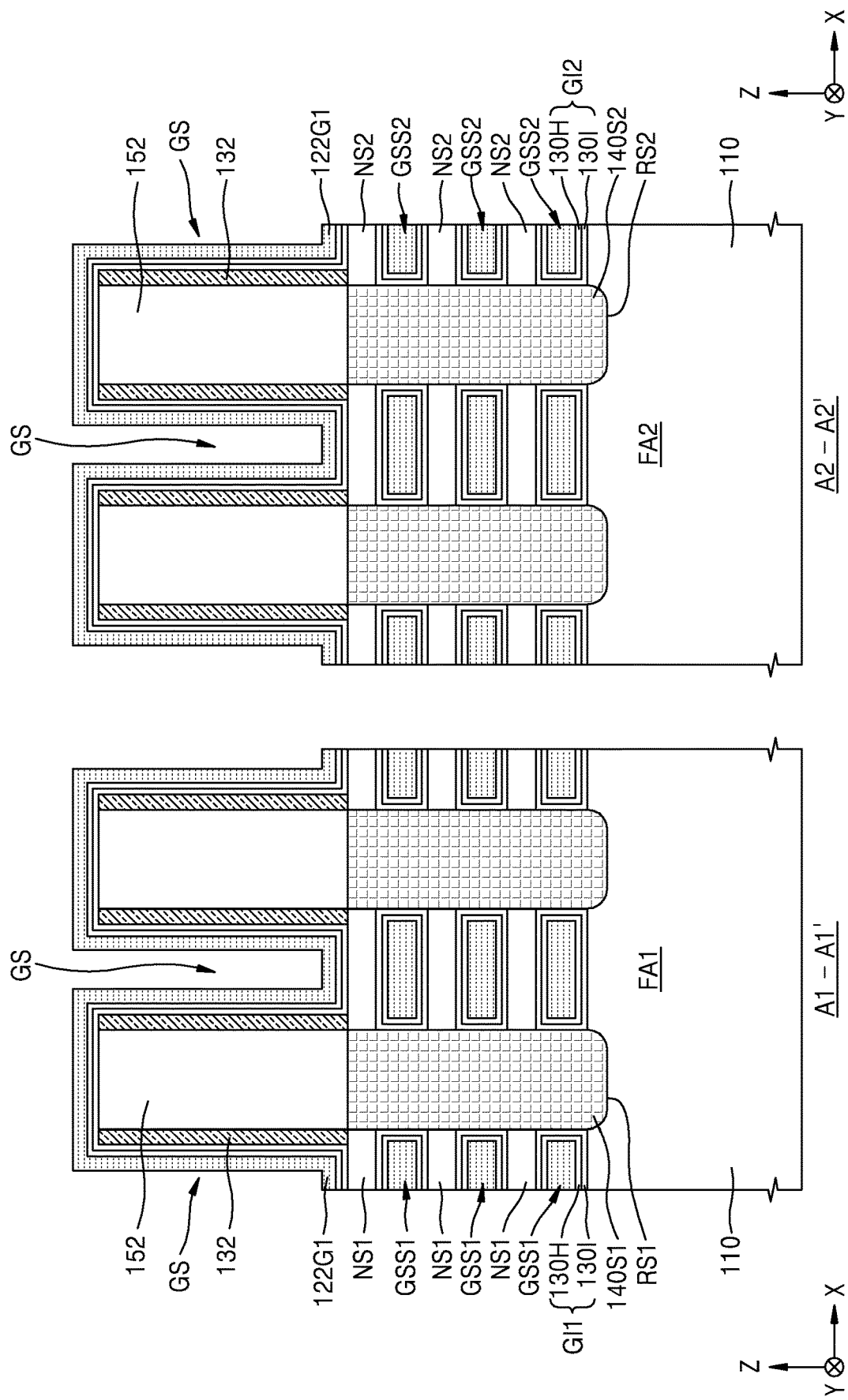

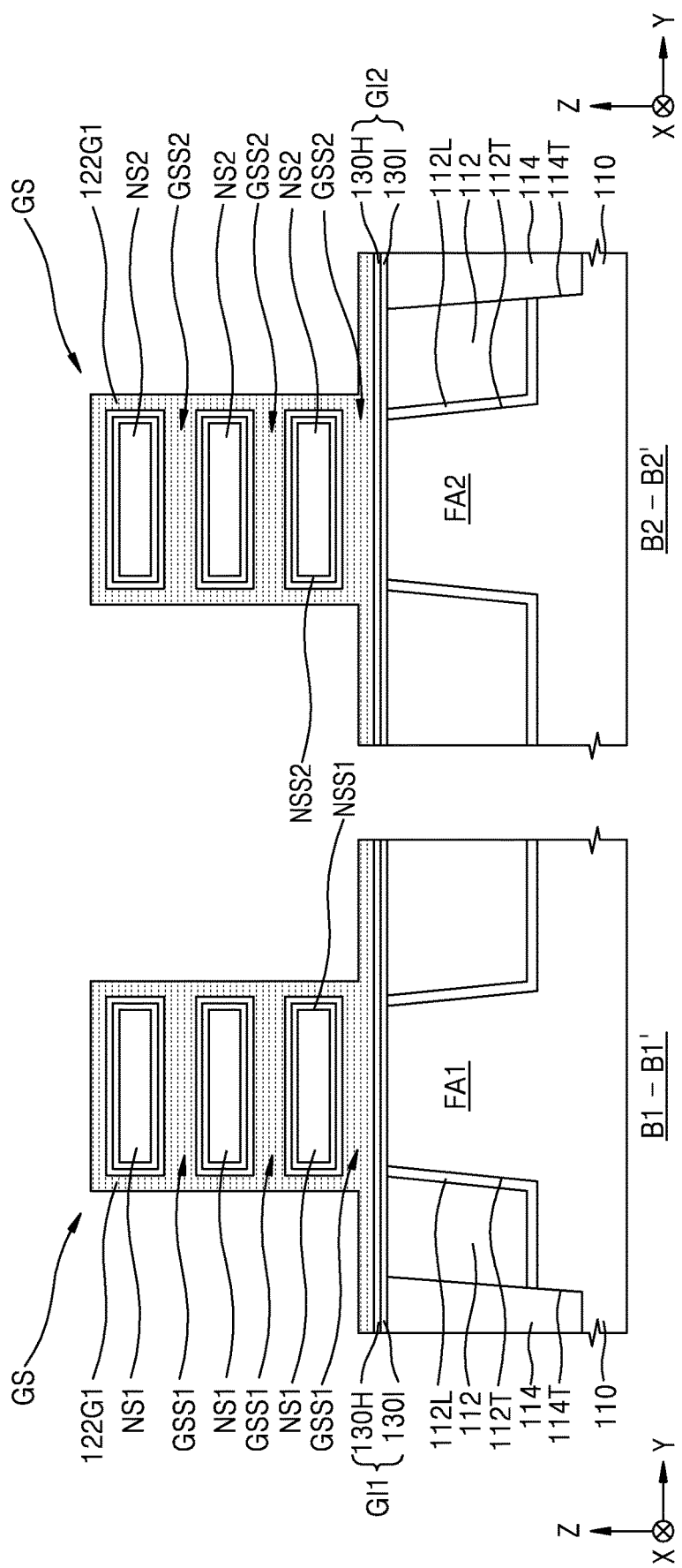

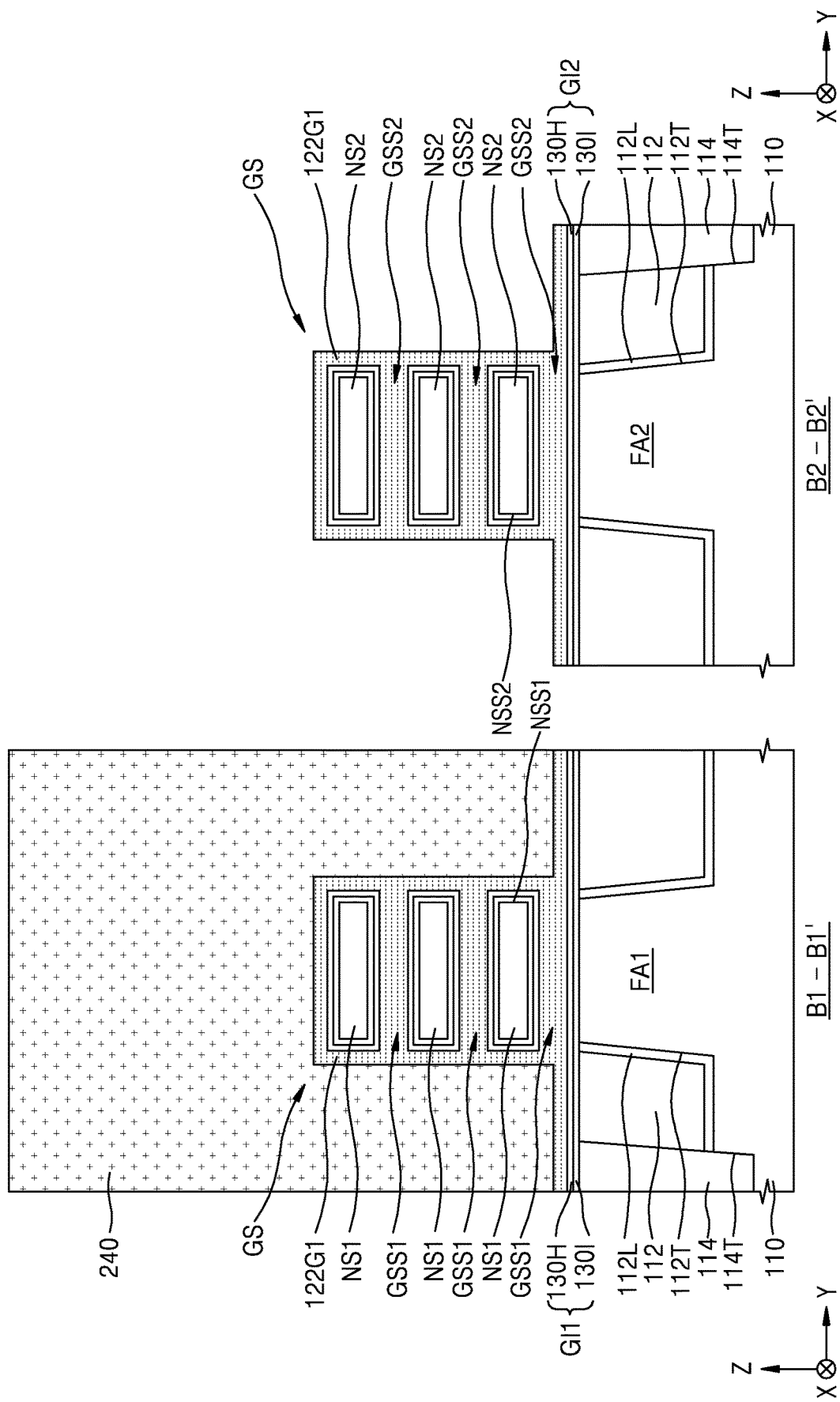

FIG. 17A
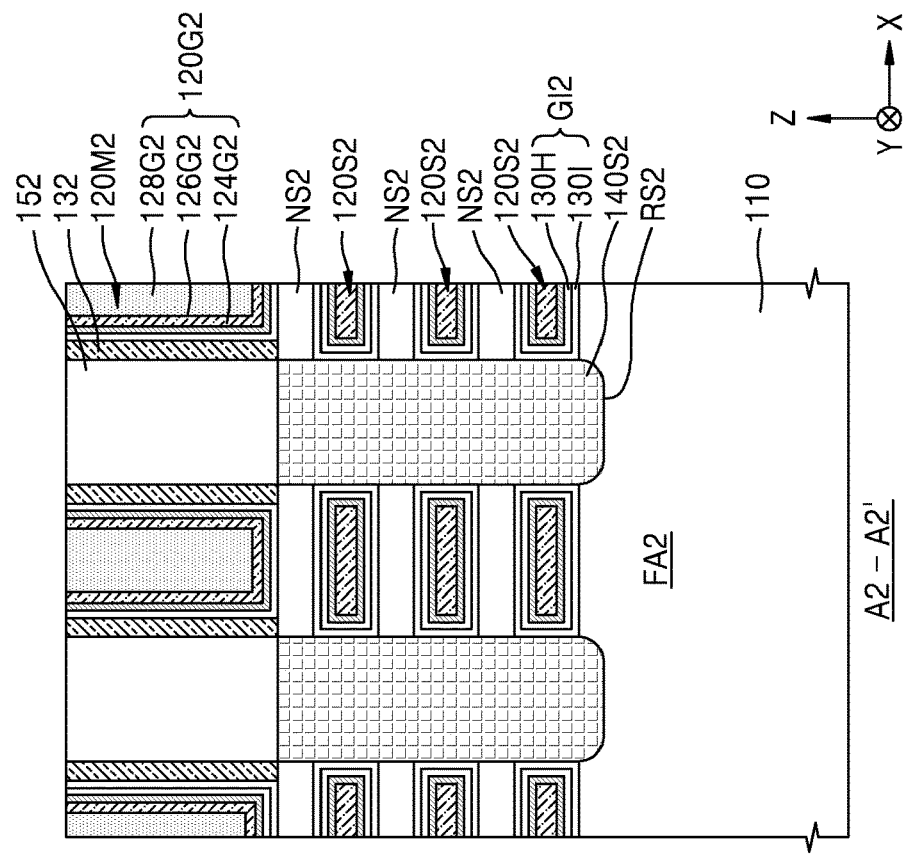
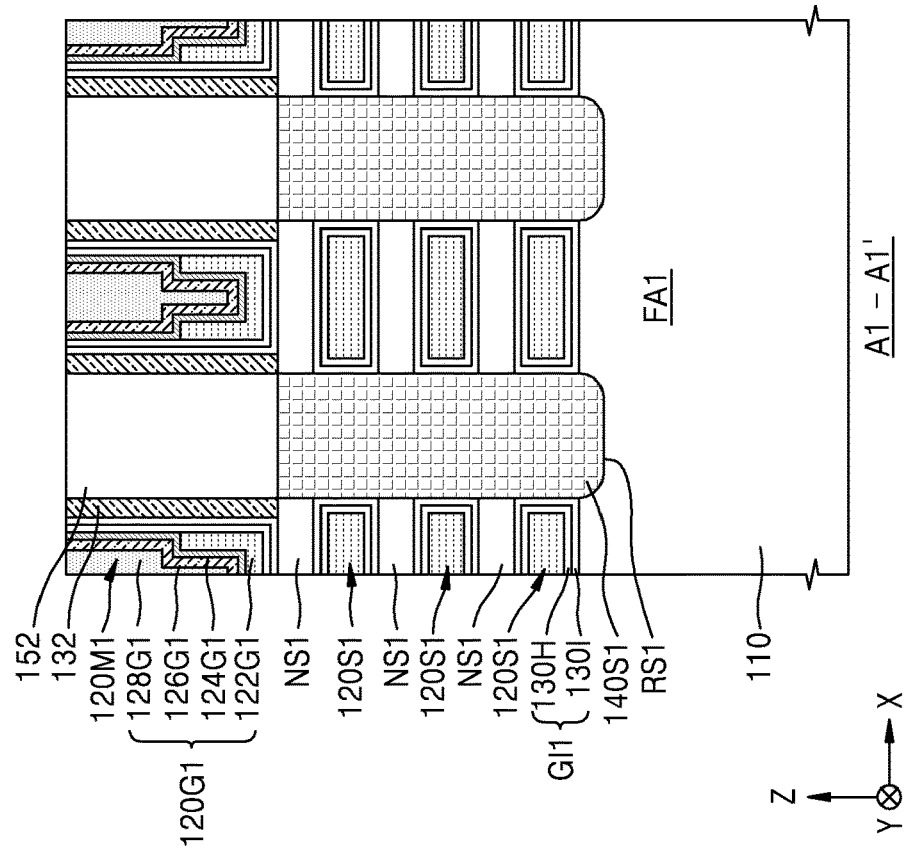

INTEGRATED CIRCUITS AND METHOD OF MANUFACTURING THE SAME

REFERENCE TO PRIORITY APPLICATION

This application claims priority to Korean Patent Application No. 10-2019-0146961, filed Nov. 15, 2019, the disclosure of which is hereby incorporated herein by reference.

BACKGROUND

The inventive concept relates to integrated circuit (IC) devices and methods of manufacturing the same and, more particularly, to IC devices having transistors therein with a multi-gate structure, and methods of manufacturing the same.

Due to the development of electronic technology, the demand for an increase in the integration density of IC devices has increased, and the downscaling of the IC devices has progressed. With the downscaling of the IC devices, undesirable short-channel effects (SCE) may occur in transistors, thereby degrading the reliability of the IC devices. To reduce the occurrence of SCE, an IC device having a multi-gate structure, such as a nanosheet transistor, has been proposed.

SUMMARY

The inventive concept provides an integrated circuit (IC) device having a precisely adjusted threshold voltage and improved performance.

The inventive concept also provides methods of manufacturing an IC device, which may provide precisely adjusted threshold voltages and improved performance.

According an embodiment of the inventive concept, an integrated circuit device is provided, which includes first and second fin-type semiconductor active regions on a substrate. A plurality of first semiconductor patterns are provided, which are stacked on the first fin-type active region as a first plurality of spaced-apart channel regions of a first FINFET. A plurality of second semiconductor patterns are provided, which are stacked on the second fin-type active region as a second plurality of spaced-apart channel regions of a second FINFET. In addition, a first gate structure is provided on the plurality of first semiconductor patterns. This first gate structure includes a first material region, which at least partially fills spaces between the first plurality of spaced-apart channel regions. A second gate structure is also provided on the plurality of second semiconductor patterns. The second gate structure includes second and third material regions, which at least partially fill spaces between the second plurality of spaced-apart channel regions.

According to some of these embodiments of the inventive concept, a percentage of oxygen content in the second material region exceeds a percentage of oxygen content in the first material region. According to other embodiments of the invention, the first material region extends on sidewalls of the plurality of first semiconductor patterns and on a top surface of an uppermost one of the plurality of first semiconductor patterns. The first gate structure may further include a composite of a fourth material region and a fifth material region, which extend on sidewalls and on a top surface of the first material region. And, a percentage of oxygen content in the fourth material region may exceed a percentage of oxygen content in the first material region.

According to other embodiments of the inventive concept, the first material region includes at least one of a metal nitride including a first metal, a metal carbide including the first metal and a metal carbonitride including the first metal. And, the second material region includes at least one of a metal oxide including a second metal, a metal oxynitride including the second metal, a metal oxycarbide including the second metal, and a metal oxycarbonitride including the second metal. The first metal may be selected from a group consisting of titanium, niobium, tantalum, molybdenum and tungsten, and the second metal may be selected from a group consisting of titanium, niobium, tantalum, molybdenum and tungsten. According to preferred aspects of these embodiments, the second material region comprises $M_xO_yN_z$, where M is a metal, O is oxygen and N is nitrogen, $x>0.0$, $z>0.0$, $0.2 \leq y \leq 0.7$ and $0.3 \leq x+z \leq 0.8$. The first material region may be electrically insulated from the plurality of first semiconductor patterns, and the second material region may be electrically insulated from the plurality of second semiconductor patterns.

An integrated circuit device according to another embodiment of the inventive concept includes first and second fin-type semiconductor active regions on a substrate, a plurality of first semiconductor patterns, which are stacked on the first fin-type active region as a first plurality of spaced-apart channel regions of a first FINFET, and a plurality of second semiconductor patterns, which are stacked on the second fin-type active region as a second plurality of spaced-apart channel regions of a second FINFET. A first gate structure provided on the plurality of first semiconductor patterns. This first gate structure includes a first material region, which surrounds and at least partially fills spaces between the first plurality of spaced-apart channel regions. A second gate structure is provided on the plurality of second semiconductor patterns. This second gate structure includes a second material region, which surrounds and at least partially fills spaces between the second plurality of spaced-apart channel regions. A percentage of oxygen content in the second material region may exceed a percentage of oxygen content in the first material region, and the second material region may be $M_xO_yN_z$, where M is a metal, O is oxygen and N is nitrogen, $x>0.0$, $z>0.0$, $0.2 \leq y \leq 0.7$ and $0.3 \leq x+z \leq 0.8$.

According to another aspect of the inventive concept, there is provided an IC device including a first fin-type active region and a second fin-type active region protruding from a substrate and extending in a first direction. A plurality of first semiconductor patterns are located apart from a top surface of the first fin-type active region. Each of the first semiconductor patterns has a channel region. A plurality of second semiconductor patterns are located apart from a top surface of the second fin-type active region. Each of the second semiconductor patterns has a channel region. A first gate structure extends in a second direction on the first fin-type active region and includes a first material layer filling a first sub-gate space between the respective first semiconductor patterns. Here, the second direction is perpendicular to the first direction. A second gate structure extends in the second direction on the second fin-type active region and includes a second material layer and a third material layer sequentially located in a second sub-gate space between the respective second semiconductor patterns.

According to another aspect of the inventive concept, there is provided an IC device including a first fin-type active region protruding from a substrate and extending in a first direction. A second fin-type active region protrudes from the substrate and is spaced apart from the first fin-type active region. The second fin-type active region extends in the first direction. A plurality of first semiconductor patterns are spaced apart from a top surface of the first fin-type active region. Each of the first semiconductor patterns has a channel region. A plurality of second semiconductor patterns are spaced apart from a top surface of the second fin-type active region. Each of the second semiconductor patterns has a channel region. A first gate structure extends in a second direction on the first fin-type active region and includes a first material layer surrounding a top surface and a bottom surface of each of the plurality of first semiconductor patterns. Here, the second direction is perpendicular to the first direction. A second gate structure extends in the second direction on the second fin-type active region and includes a second material layer surrounding a top surface and a bottom surface of each of the plurality of second semiconductor patterns. A content of oxygen included in the second material layer is higher than a content of oxygen included in the first material layer.

According to another aspect of the inventive concept, there is provided an IC device including a first fin-type active region protruding from a substrate and extending in a first direction. A second fin-type active region protrudes from the substrate and is spaced apart from the first fin-type active region. The second fin-type active region extends in the first direction. A plurality of first semiconductor patterns are spaced apart from a top surface of the first fin-type active region. Each of the first semiconductor patterns has a channel region. A plurality of second semiconductor patterns are spaced apart from a top surface of the second fin-type active region. Each of the second semiconductor patterns has a channel region. A first gate structure extends in a second direction on the first fin-type active region and includes a first material layer surrounding a top surface and a bottom surface of the plurality of first semiconductor patterns. Here, the second direction is perpendicular to the first direction. A second gate structure extends in the second direction on the second fin-type active region and includes a second material layer surrounding a top surface and a bottom surface of each of the plurality of second semiconductor patterns. A content of oxygen included in the second material layer is higher than a content of oxygen included in the first material layer. The first material layer has a first thickness, and the second material layer has a second thickness that is less than the first thickness.

BRIEF DESCRIPTION OF THE DRAWINGS

Embodiments of the inventive concept will be more clearly understood from the following detailed description taken in conjunction with the accompanying drawings in which:

FIG. 2A shows cross-sectional views taken along lines A1-A1' and A2-A2' of FIG. 1;

FIGS. 3A and 3B are cross-sectional views of an IC device according to example embodiments;

FIGS. 4A and 4B are cross-sectional views of an IC device according to example embodiments;

FIGS. 5A, 5B, 6A, 6B, 7, 8, 9A, 9B, 10A, 10B, 11A, 11B, 12A, 12B, 13A, 13B, 14A, 14B, 15A, 15B, 16A, 16B, 17A, and 17B are cross-sectional views illustrating a method of manufacturing an IC device, according to example embodiments.

DETAILED DESCRIPTION OF THE EMBODIMENTS

Hereinafter, example embodiments will be described in detail with reference to the accompanying drawings.

Figure 1:
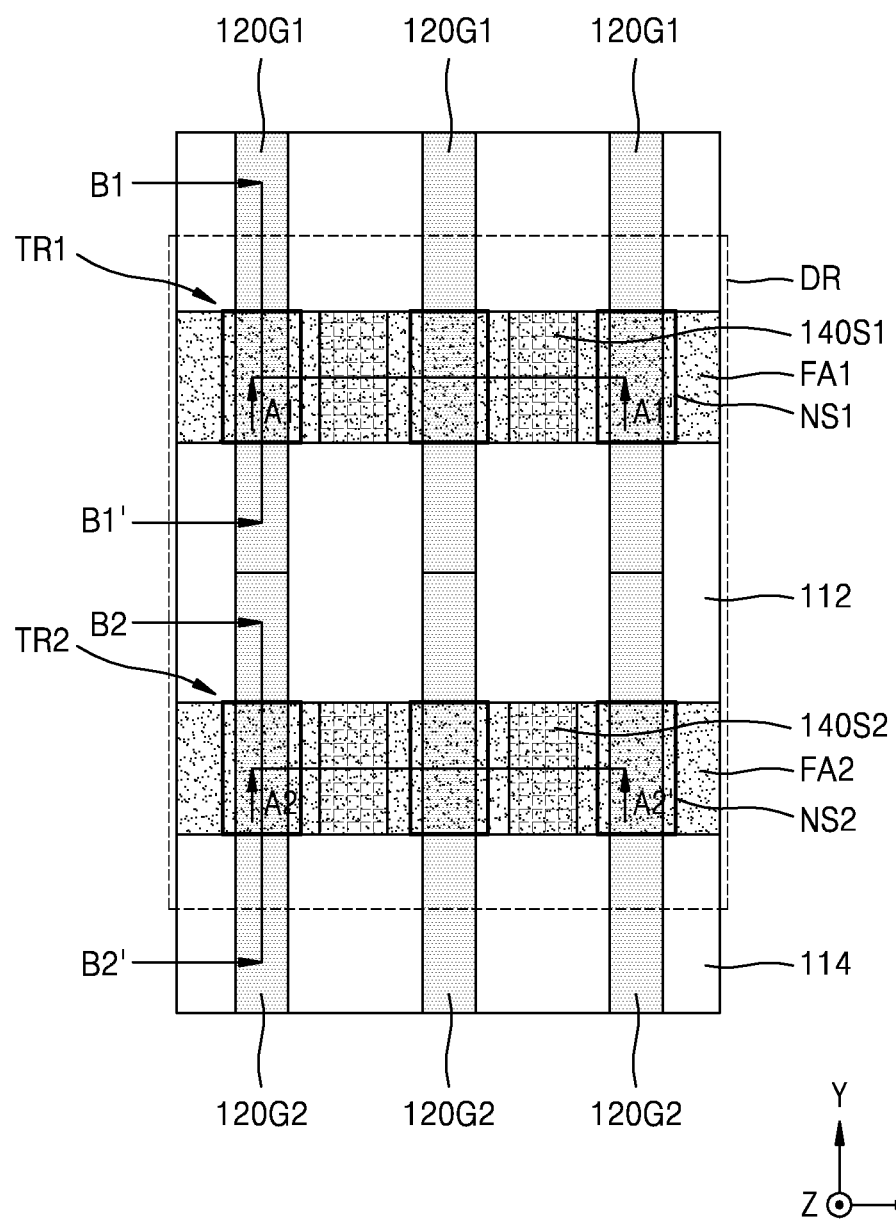
FIG. 1 illustrates the layout of an integrated circuit (IC) device according to example embodiments.
Figure 2B:
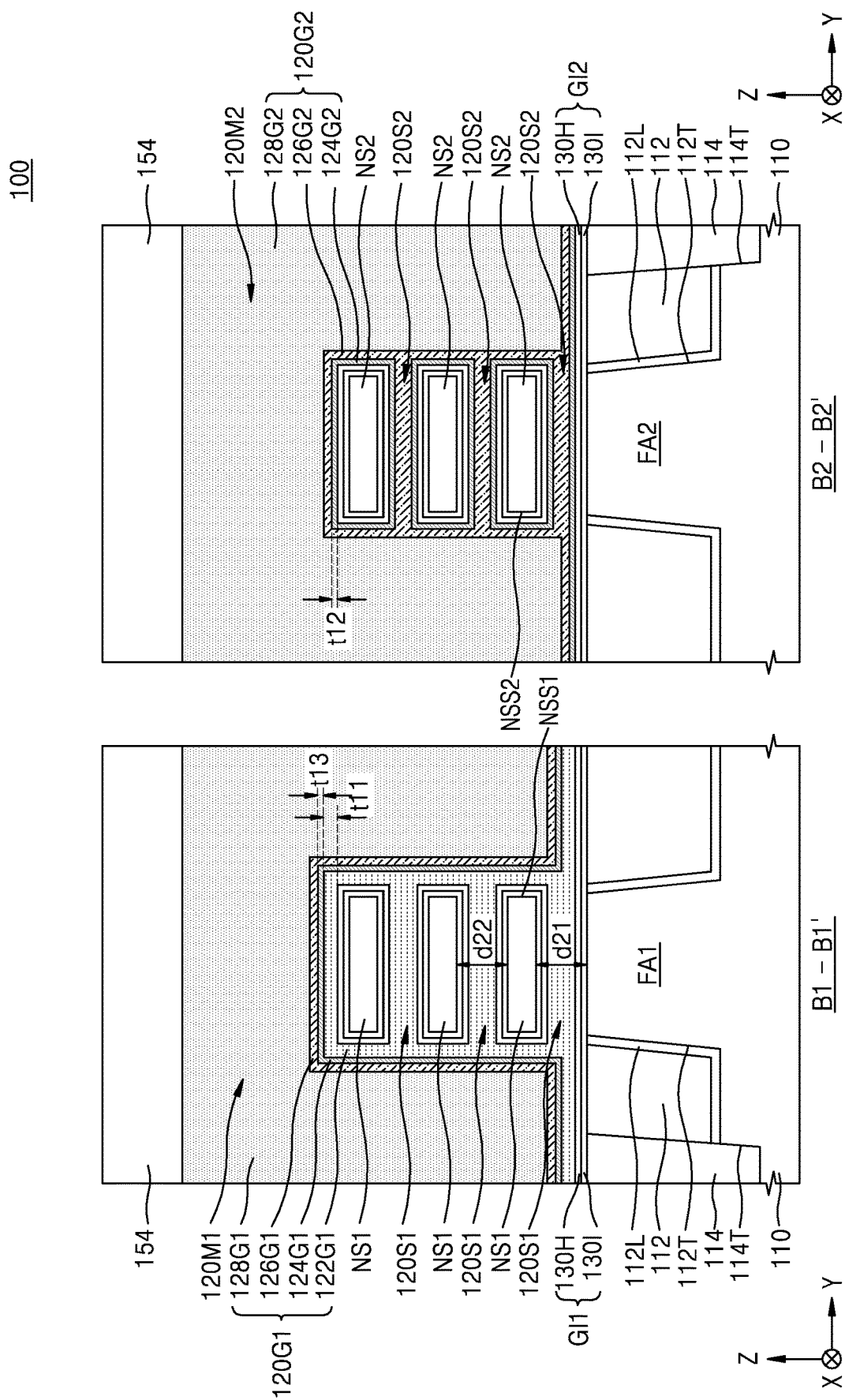
FIG. 2B shows cross-sectional views taken along lines B1-B1' and B2-B2' of FIG. 1.

FIG. 1 illustrates the layout of an integrated circuit (IC) device 100 according to example embodiments. FIG. 2A shows cross-sectional views of the IC device 100 taken along lines A1-A1' and A2-A2' of FIG. 1; and FIG. 2B shows cross-sectional views of the IC device 100 taken along lines B1-B1' and B2-B2' of FIG. 1.

Referring to FIGS. 1 to 2B, a substrate 110 may include a first fin-type active region FA1 and a second fin-type active region FA2. The first fin-type active region FA1 and the second fin-type active region FA2 may respectively constitute a first transistor TR1 and a second transistor TR2, which have different threshold voltages. In example embodiments, the first transistor TR1 may include a PMOS transistor, and the second transistor TR2 may include an NMOS transistor. In other embodiments, the first transistor TR1 may include an NMOS transistor having a first threshold voltage, and the second transistor TR2 may include an NMOS transistor having a second threshold voltage different from the first threshold voltage. In other embodiments, the first transistor TR1 may include a PMOS transistor having the first threshold voltage, and the second transistor TR2 may include a PMOS transistor having the second threshold voltage different from the first threshold voltage.

The substrate 110 may include a semiconductor material, such as silicon (Si) or germanium (Ge), or a compound semiconductor, such as such as silicon germanium (SiGe), silicon carbide (SiC), gallium arsenide (GaAs), indium arsenide (InAs), or indium phosphide (InP). In some embodiments, the substrate 110 may include at least one of a Group III-V material and a Group IV material. The Group III-V material may be a binary compound, ternary compound, or quaternary compound including at least one Group III element and at least one Group V element. The Group III-V material may be a compound including at least one Group III element and at least one Group V element. The at least one Group III element may be at least one element of indium (In), gallium (Ga), and aluminum (Al), and the at least one Group V element may be at least one element of arsenic (As), phosphorus (P), and antimony (Sb). For example, the Group III-V material may be selected from InP, $In_zGa_{1-z}As$ (0≤z≤1), and $Al_zGa_{1-z}As$ (0≤z≤1). The binary compound may be, for example, any one of indium phosphide (InP), gallium arsenide (GaAs), indium arsenide (InAs), indium antimonide (InSb), and gallium antimonide (GaSb). The ternary compound may be any one of indium gallium phosphide (InGaP), indium gallium arsenide (InGaAs), aluminum indium arsenide (AlInAs), indium gallium antimonide (InGaSb), gallium arsenic antimonide (GaAsSb), and gallium arsenic phosphide (GaAsP). The Group IV material may be silicon or germanium. However, a Group III-V material and a Group IV material, which may be used in an IC device according to an embodiment, are not limited to the examples described herein.

The Group III-V material and the Group IV material (e.g., germanium) may be used as materials for forming channels of low-power, high-speed, transistors. A highly efficient complementary CMOS device may be formed by using a semiconductor substrate including a Group III-V material (e.g., GaAs) having a higher electron mobility than a silicon substrate and a semiconductor substrate including a semiconductor material (e.g., Ge) having a higher hole mobility than the silicon substrate. In some embodiments, when an NMOS transistor is formed on the substrate 110, the substrate 110 may include any one of the Group III-V materials described above. In some other embodiments, when a PMOS transistor is formed on the substrate 110, at least a portion of the substrate 110 may include Ge.

In example embodiments, the substrate 110 may have a semiconductor on insulator (SOI) structure, such as a silicon-on-insulator structure. The substrate 110 may include a conductive region, for example, a doped well or a doped structure.

Each of the first fin-type active region FA1 and the second fin-type active region FA2 may extend in a first direction (X direction) on the substrate 110 and protrude in a vertical direction (Z direction) from a top surface of the substrate 110. The second fin-type active region FA2 may be spaced apart from the first fin-type active region FA1 in a second direction (Y direction) perpendicular to the first direction (X direction).

A device isolation trench 112T may be formed in the substrate 110 to define the first fin-type active region FA1 and the second fin-type active region FA2, and a deep trench 114T may be formed in the substrate 110 to define a device region DR. A device isolation film 112 may be located inside the device isolation trench 112T, and a deep trench insulating film 114 may be located inside the deep trench 114T.

For example, the device isolation film 112 may be located on both sidewalls of the first fin-type active region FA1 and the second fin-type active region FA2. Moreover, a device isolation liner 112L may be conformally formed and extend between the device isolation film 112 and an inner wall of the device isolation trench 112T. FIG. 2B illustrates an example in which a top surface of the device isolation film 112 is at the same level as top surfaces of the first and second fin-type active regions FA1 and FA2. However, in another embodiment, the top surface of the device isolation film 112 may be at a lower level than the top surfaces of the first and second fin-type active regions FA1 and FA2. Therefore, only lower portions of the sidewalls of the first and second fin-type active regions FA1 and FA2 may be surrounded by the device isolation film 112. The deep trench insulating film 114 may include silicon oxide, silicon nitride, or a combination thereof.

A plurality of first semiconductor patterns NS1 may be spaced apart from the top surface of the first fin-type active region FA1 in the vertical direction (Z direction) on the first fin-type active region FA1. The plurality of first semiconductor patterns NS1 may include the same material as the substrate 110 in some embodiments. For example, the plurality of first semiconductor patterns NS1 may include a semiconductor, such as silicon or germanium, or a compound semiconductor, such as silicon germanium, silicon carbide, gallium arsenide, indium arsenide, or indium phosphide. Each of the plurality of first semiconductor patterns NS1 may include a channel region.

Each of the plurality of first semiconductor patterns NS1 may have a relatively great width in the second direction (Y direction) and have a thickness (refer to t22 in FIG. 5B), which is relatively small in the vertical direction (Z direction). For example, each of the plurality of first semiconductor patterns NS1 may have a nanosheet shape. In example embodiments, each of the plurality of first semiconductor patterns NS1 may have a width of about 5 nm to about 100 nm in the second direction (Y direction) and have a thickness t22 of about 1 nm to about 10 nm, but is not limited thereto.

As shown in FIG. 2B, the plurality of first semiconductor patterns NS1 may be spaced apart from each other by an equivalent distance. For example, a first distance d21 between a lowermost first semiconductor pattern NS1 and the top surface of the first fin-type active region FA1 may be substantially equal to a second distance d22 between the lowermost first semiconductor pattern NS1 and a first semiconductor pattern NS1 adjacent thereto. However, the inventive concept is not limited thereto, and a distance between the respective first semiconductor patterns NS1 may be modified to be suitable with other embodiments. Also, the number of first semiconductor patterns NS1 is not limited to only those shown in FIGS. 2A and 2B.

The plurality of second semiconductor patterns NS2 may be spaced apart from the top surface of the second fin-type active region FA2 in the vertical direction (Z direction) on the second fin-type active region FA2. The plurality of second semiconductor patterns NS2 may include the same material as the substrate 110, and each of the plurality of second semiconductor patterns NS2 may include a channel region.

Each of the plurality of second semiconductor patterns NS2 may have a relatively large width in the second direction (Y direction) and have a relatively small thickness in the vertical direction (Z direction). For example, each of the plurality of second semiconductor patterns NS2 may have a nanosheet shape. In example embodiments, a width of each of the plurality of second semiconductor patterns NS2 may be equal to or different from a width of each of the plurality of first semiconductor patterns NS1. In addition, a thickness of each of the plurality of second semiconductor patterns NS2 may be equal to the thickness t22 of each of the plurality of first semiconductor patterns NS1, but the inventive concept is not limited thereto.

A first gate structure 120G1 may surround the plurality of first semiconductor patterns NS1 on the first fin-type active region FA1 and extend in the second direction (Y direction). The first gate structure 120G1 may include a first main gate portion 120M1 covering a top surface of an uppermost first semiconductor pattern NS1 and a plurality of first sub-gate portions 120S1 formed in spaces between the first fin-type active region FA1 and a lowermost first semiconductor pattern NS1 and between adjacent ones of the plurality of first semiconductor patterns NS1. The first gate structure 120G1 may include a first material layer 122G1, a fourth material layer 124G1, a fifth material layer 126G1, and a first buried conductive layer 128G1.

A second gate structure 120G2 may surround the plurality of second semiconductor patterns NS2 on the second fin-type active region FA2 and extend in the second direction (Y direction). FIG. 1 illustrates an example in which the second gate structure 120G2 is located to be collinear with the first gate structure 120G1, and an end portion of the second gate structure 120G2 is connected to an end portion of the first gate structure 120G1. However, unlike the embodiment of FIG. 1, the second gate structure 120G2 may be spaced apart from the end portion of the first gate structure 120G1.

The second gate structure 120G2 may include a second main gate portion 120M2 covering a top surface of an uppermost second semiconductor pattern NS2 and a plurality of second sub-gate portions 120S2 formed in spaces between the second fin-type active region FA2 and a lowermost second semiconductor pattern NS2 and between adjacent ones of the plurality of second semiconductor patterns NS2. The second gate structure 120G2 may include a second material layer 124G2, a third material layer 126G2, and a second buried conductive layer 128G2.

A first gate insulating layer GI1 may be located on the top surface of the first fin-type active region FA1 and extend on the device isolation film 112 and the deep trench insulating film 114. Also, the first gate insulating layer GI1 may surround the first semiconductor pattern NS1 in the plurality of first sub-gate portion 120S1. A second gate insulating layer GI2 may be located on the top surface of the second fin-type active region FA2 and extend on the device isolation film 112 and the deep trench insulating film 114. Also, the second gate insulating layer GI2 may surround the second semiconductor pattern NS2 in the plurality of second sub-gate portion 120S2.

In the first gate structure 120G1, the first material layer 122G1 may surround the plurality of first semiconductor patterns NS1 and extend on the device isolation film 112 and the deep trench insulating film 114. The first material layer 122G1 may fill inner spaces of the plurality of first sub-gate portions 120S1 on the first gate insulating layer GI1. The first material layer 122G1 may surround first sidewalls NSS1 of the plurality of first semiconductor patterns NS1, which are spaced apart from each other in the second direction (Y direction), and may be located on a top surface of the uppermost first semiconductor pattern NS1.

In the second gate structure 120G2, the second material layer 124G2 and the third material layer 126G2 may surround the plurality of second semiconductor patterns NS2 and extend on the device isolation film 112 and on the deep trench insulating film 114. The second material layer 124G2 and the third material layer 126G2 may fill inner spaces of the plurality of second sub-gate portions 120S2 on the second gate insulating layer GI2. The second material layer 124G2 and the third material layer 126G2 may surround second sidewalls NSS2 of the plurality of second semiconductor patterns NS2, which are spaced apart from each other in the second direction (Y direction), and be located on a top surface of the uppermost second semiconductor pattern NS2.

In example embodiments, the first material layer 122G1 may include at least one a metal nitride including a first metal, a metal carbide including the first metal, and a metal carbonitride including the first metal, and the first metal may include at least one of titanium, tantalum, niobium, molybdenum, and tungsten. In some examples, the first material layer 122G1 may include titanium nitride. The first material layer 122G1 may function as a work-function adjusting layer for adjusting a threshold voltage of the first transistor TR1.

In example embodiments, the second material layer 124G2 may include at least one of a metal oxide including a second metal, a metal oxynitride including the second metal, a metal oxycarbide including the second metal, and a metal oxycarbonitride including the second metal, and the second metal may include at least one of titanium, tantalum, niobium, molybdenum, and tungsten. In some examples, the second material layer 124G2 may be expressed by the formula $M_xO_yN_z$, where M is the second metal, O is oxygen, N is nitrogen, and where: $0.2 \leq y \leq 0.7$, $0.3 \leq x+z \leq 0.8$, and $0 \leq z \leq 0.5$.

The second material layer 124G2 may include a material having a higher percentage oxygen content than a material included in the first material layer 122G1. Here, the percentage oxygen content of the material included in the first material layer 122G1 may be approximately zero. Alternatively, the percentage oxygen content of the material included in the first material layer 122G1 may be greater than zero, but lower than the percentage oxygen content of the material included in the second material layer 124G2. For example, the first material layer 122G1 may include titanium nitride, and the second material layer 124G2 may include titanium oxide. Alternatively, the first material layer 122G1 may include titanium nitride, and the second material layer 124G2 may include titanium oxynitride.

The third material layer 126G2 may include aluminum (Al), copper (Cu), titanium (Ti), tantalum (Ta), tungsten (W), molybdenum (Mo), tantalum nitride (TaN), nickel silicide (NiSi), cobalt silicide (CoSi), titanium nitride (TiN), tungsten nitride (WN), titanium aluminide (TiAl), titanium aluminum carbide (TiAlC), titanium aluminum nitride (TiAlN), tantalum carbonitride (TaCN), tantalum carbide (TaC), tantalum silicon nitride (TaSiN), or a combination thereof, but is not limited thereto. In some examples, the third material layer 126G2 may include a material having a smaller work function than the first material layer 122G1 and the second material layer 124G2. In some examples, the third material layer 126G2 may include a material having a higher aluminum (Al) content than the first material layer 122G1 and the second material layer 124G2.

The second material layer 124G2 and the third material layer 126G2 may function as a work-function adjusting layer for adjusting a threshold voltage of the second transistor TR2. Also, the second material layer 124G2 may function as a barrier layer configured to prevent the consumption or a deficiency of oxygen in a high-k dielectric layer 130H of the second gate insulating layer GI2 during the formation of the third material layer 126G2. Since the second material layer 124G2 adjusts the threshold voltage of the second transistor TR2 and simultaneously, prevents the consumption or a deficiency of oxygen in the high-k dielectric layer 130H, the second transistor TR2 may have a reduced leakage current.

In the first gate structure 120G1, the fourth material layer 124G1 and the fifth material layer 126G1 may be located on the first material layer 122G1. The fourth material layer 124G1 and the fifth material layer 126G1 may be located in the first main gate portion 120M1, and also located on the first sidewalls NSS1 of the plurality of first semiconductor patterns NS1 and the uppermost first semiconductor pattern NS1. The fourth material layer 124G1 and the fifth material layer 126G1 may not be located in the sub-gate portion 120S1 between the plurality of first semiconductor patterns NS1. In some embodiments, the fourth material layer 124G1 may include at least one of a metal oxide including a second metal, a metal oxynitride including the second metal, a metal oxycarbide including the second metal, and a metal oxycarbonitride including the second metal, and the second metal may include at least one of titanium, tantalum, niobium, molybdenum, and tungsten.

In some additional embodiments, the fourth material layer 124G1 may be expressed by the chemical formula $M_xO_yN_z$, where M is the second metal, O is oxygen, N is nitrogen, $0.2 \leq y \leq 0.7$, $0.3 \leq x+z \leq 0.8$, and $0 \leq z \leq 0.5$. The fourth material layer 124G1 may be formed simultaneously with the second material layer 124G2 or formed using a process that is performed under the same formation conditions as a process of forming the second material layer 124G2. Thus, a content of oxygen in the fourth material layer 124G1 may be higher than a content of oxygen in the first material layer 122G1.

The fifth material layer 126G1 may include aluminum, copper, titanium, tantalum, tungsten, molybdenum, tantalum nitride, nickel silicide, cobalt silicide, titanium nitride, tungsten nitride, titanium aluminide, titanium aluminum carbide, titanium aluminum nitride, tantalum carbonitride, tantalum carbide, tantalum silicon nitride, or a combination thereof, but is not limited thereto. The fifth material layer 126G1 may be formed simultaneously with the third material layer 126G2 or formed using a process that is performed under the same formation conditions as a process of forming the third material layer 126G2.

The first buried conductive layer 128G1 and the second buried conductive layer 128G2 may include aluminum, copper, titanium, tantalum, tungsten, molybdenum, tantalum nitride, nickel silicide, cobalt silicide, titanium nitride, tungsten nitride, titanium aluminide, titanium aluminum carbide, titanium aluminum nitride, tantalum carbonitride, tantalum carbide, tantalum silicon nitride, or a combination thereof, but is not limited thereto. The first buried conductive layer 128G1 may surround the fifth material layer 126G1 and fill the first main gate portion 120M1 extending in the second direction (Y direction). The second buried conductive layer 128G2 may surround the third material layer 126G2 and fill the second main gate portion 120M2 extending in the second direction (Y direction).

As shown in FIG. 2B, the first material layer 122G1 may have a first thickness t11 on the top surface of the uppermost first semiconductor pattern NS1 or on the device isolation film 112. The first thickness t11 may range from about 1 nm to about 10 nm but is not limited thereto. The first thickness t11 may be greater than one-half (½) a thickness of each of the plurality of first sub-gate portions 120S1. Here, the thickness of each of the plurality of first sub-gate portions 120S1 may correspond to a distance between a surface of the first gate insulating layer GI1 on one first semiconductor pattern NS1 and a surface of the first gate insulating layer GI1 on another first semiconductor pattern NS1 adjacent thereto. Thus, the first material layer 122G1 may fill each of the plurality of first sub-gate portions 120S1.

The second material layer 124G2 may have a second thickness t12 on the top surface of the uppermost second semiconductor pattern NS2 or on the device isolation film 112. The second thickness t12 may be less than the first thickness t11. The second thickness t12 may be less than ½ of a thickness of each of the plurality of second sub-gate portions 120S2. Here, the thickness of each of the plurality of second sub-gate portions 120S2 may correspond to a distance between a surface of the second gate insulating layer GI2 on one second semiconductor pattern NS2 and a surface of the second gate insulating layer GI2 on another second semiconductor pattern NS2 adjacent thereto. Thus, the second material layer 124G2 may not completely fill each of the plurality of second sub-gate portions 120S2. In some examples, the second thickness t12 may be about 2 nm or less but is not limited thereto.

The fourth material layer 124G1 may have a third thickness t13 on the top surface of the uppermost first semiconductor pattern NS1 or on the device isolation film 112. The third thickness t13 may be less than the first thickness t11 of the first material layer 122G1. The fourth material layer 124G1 may be formed simultaneously with the second material layer 124G2 or, alternatively, formed using a process that is performed under similar formation conditions as a process of forming the second material layer 124G2.

In an exemplary manufacturing process, a mask layer (refer to 240 in FIG. 14B) may be formed on the first fin-type active region FA1 to cover the first material layer 122G1. A portion of the first material layer 122G1, which is formed in a second sub-gate space (refer to GSS2 in FIG. 14B), may be removed, and the second material layer 124G2 may then be formed. In this case, since the plurality of first sub-gate portions 120S1 are filled with the first material layer 122G1, the first material layer 122G1 located in the plurality of first sub-gate portions 120S1 may be prevented from being undesirably oxidized during the formation of the second material layer 124G2 to have a relatively high oxygen content. Accordingly, a threshold voltage of each of the first transistor TR1 and the second transistor TR2 may be precisely controlled.

As shown in FIG. 2B, each of the first and second gate insulating layers GI1 and GI2 may have a stack structure of an interface layer 130I and the high-k dielectric layer 130H. The interface layer 130I may cure interfacial defects between the top surfaces of the first and second fin-type active regions FA1 and FA2 and the high-k dielectric layer 130H and between surfaces of the plurality of first and second semiconductor patterns NS1 and NS2 and the high-k dielectric layer 130H.

In an embodiment, the interface layer 130I may include a low-k material layer having a dielectric constant of about 9 or lower, such as a silicon oxide film, a silicon oxynitride film, a gallium (Ga) oxide film, a germanium (Ge) oxide film, or a combination thereof. In an embodiment, the interface layer 130I may include a silicate, a combination of a silicate and a silicon oxide film, or a combination of a silicate and a silicon oxynitride film. In an embodiment, the interface layer 130I may be omitted.

The high-k dielectric layer 130H may include a material having a higher dielectric constant than the silicon oxide film. For example, the high-k dielectric layer 130H may have a dielectric constant of about 10 to about 25. The high-k dielectric layer 130H may include a material selected from a group consisting of hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof, but materials included in the high-k dielectric layer 130H are not limited thereto. The high-k dielectric layer 130H may be formed using an atomic layer deposition (ALD) process, a chemical vapor deposition (CVD) process, or a physical vapor deposition (PVD) process. The high-k dielectric layer 130H may have a thickness of about 10 Å to about 40 Å but is not limited thereto.

Gate spacers 132 may be located on both sidewalls of the first and second gate structures 120G1 and 120G2. The gate spacers 132 may include silicon nitride or silicon oxynitride. Although not shown, the gate spacers 132 may have a multilayered structure including a plurality of material layers that are sequentially formed on the both sidewalls of the first and second gate structures 120G1 and 120G2.

First recesses RS1 may be formed in the first fin-type active region FA1 on both sides of the plurality of first semiconductor patterns NS1, and a first semiconductor layer 140S1 may fill the first recesses RS1. The first semiconductor layer 140S1 may be connected to one end of each of the plurality of first semiconductor patterns NS1. The first semiconductor layer 140S1 may be grown from the first fin-type active region FA1 and the plurality of first semiconductor patterns NS1 using a selective epitaxial growth (SEG) process. Furthermore, second recesses RS2 may be formed in the second fin-type active region FA2 on both sides of the plurality of second semiconductor patterns NS2, and a second semiconductor layer 140S2 may fill the second recesses RS2. Each of the first semiconductor layer 140S1 and the second semiconductor layer 140S2 may include an epitaxially grown silicon (Si) layer, an epitaxially grown silicon carbide (SiC) layer, or an embedded silicon germanium (SiGe) structure including a plurality of epitaxially grown SiGe layers.

An inter-gate dielectric layer 152 may be located on both sidewalls of the gate spacers 132, the first semiconductor layer 140S1, and the second semiconductor layer 140S2. An upper insulating layer 154 may be located on the first and second gate structures 120G1 and 120G2 and the inter-gate dielectric layer 152. A first contact plug 160C1 may be located inside a first contact hole 160H1, which passes through the upper insulating layer 154 and the inter-gate dielectric layer 152 and exposes a top surface of the first semiconductor layer 140S1. Also, a second contact plug 160C2 may be located inside a second contact hole 160H2, which passes through the upper insulating layer 154 and the inter-gate dielectric layer 152 and exposes a top surface of the second semiconductor layer 140S2. A metal silicide layer 162 may be further formed between the first contact plug 160C1 and the first semiconductor layer 140S1 and between the second contact plug 160C2 and the second semiconductor layer 140S2, as shown. This metal silicide layer 162 may include titanium silicide or cobalt silicide in some embodiments, but is not limited thereto.

According to the above-described example embodiments, the second gate structure 120G2 may include the second material layer 124G2, including oxygen, as a work-function material layer to thereby improve the electrical performance of the IC device 100. Hereinafter, the electrical performance related to the second material layer 124G2 will be described with reference to FIG. 18.

Figure 18:
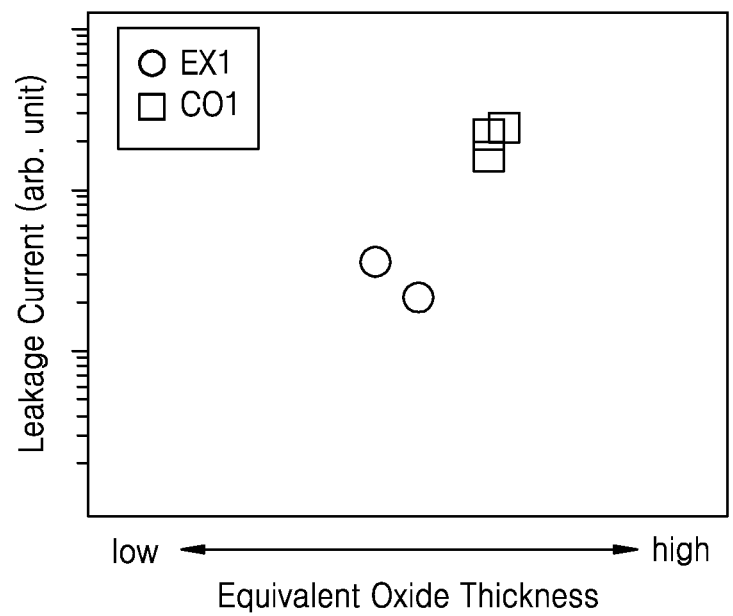
FIG. 18 is a graph showing an equivalent oxide thickness and a leakage current of an IC according to example embodiments.

FIG. 18 is a graph showing an equivalent oxide thickness and a leakage current of an IC device according to example embodiments. Referring to FIG. 18, an equivalent oxide thickness and a leakage current of the second gate structure 120G2 having a stack structure of the second material layer 124G2 and the third material layer 126G2 were measured. In Example EX1, titanium oxide ($TiO_x$) was used as the second material layer 124G2. In comparative example CO1, titanium nitride (TiN) was used as the second material layer 124G2. Referring to FIG. 18, it can be seen that in Example EX1, significantly low leakage currents were measured at levels of equivalent oxide thickness, which were equal to those of comparative example CO1. Accordingly, it can be seen that the electrical performance of the IC device 100 may be improved when a metal oxide having a higher oxygen content is used as a work-function adjusting layer of the second gate structure 120G.

In general, work-function adjusting layers of a first gate structure and a second gate structure may be formed using the same material to different thicknesses so that a first transistor and a second transistor may have different threshold voltages. For example, a first work-function adjusting material layer may be formed in both a first transistor forming region and a second transistor forming region. The first work-function adjusting material layer may be removed from the second transistor forming region, and a second work-function adjusting material layer may be then formed in the second transistor forming region. However, in an IC device including a plurality of nanosheet semiconductor patterns, the difficulty of a process of selectively removing or forming a work-function adjusting material layer located in a space between the plurality of semiconductor patterns may be relatively high.

However, according to the IC device 100 described with reference to FIGS. 1 to 2B, the first material layer 122G1 having a relatively low oxygen content (or an oxygen content of about 0) may be formed in the first gate structure 120G1, and the second material layer 124G2 having a relatively high oxygen content may be formed in the second gate structure 120G2. Thus, the IC device 100 may have a reduced leakage current.

Furthermore, during the formation of the second material layer 124G2 to have a relatively high oxygen content, the first material layer 122G1 located in the plurality of first sub-gate portions 120S1 may be prevented from being undesirably oxidized. Thus, the threshold voltage of each of the first transistor TR1 and the second transistor TR2 may be precisely controlled. Accordingly, the IC device 100 may have improved performance.

Figure 3B:
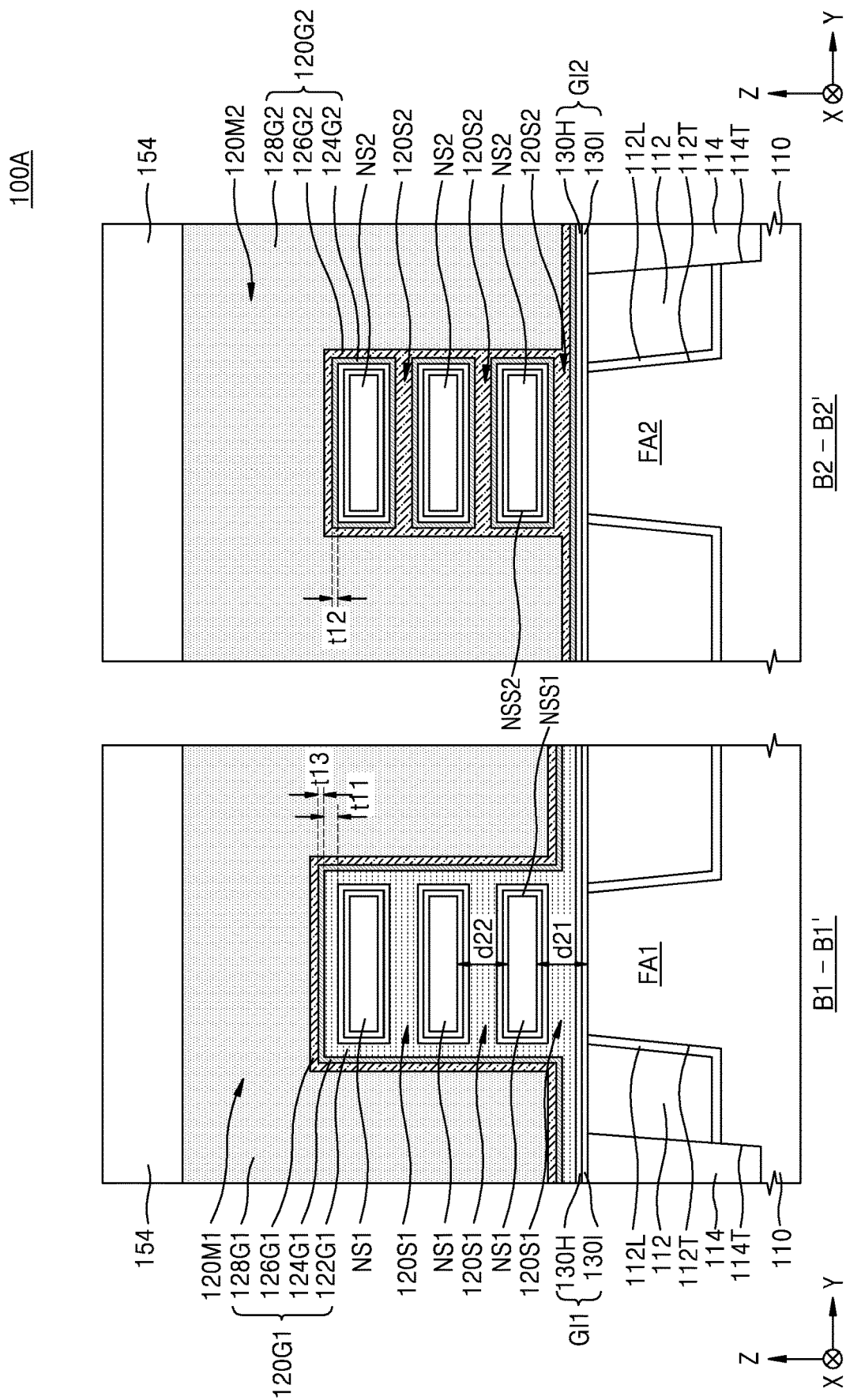

FIGS. 3A and 3B are cross-sectional views of an IC device 100A according to example embodiments. FIG. 3A shows cross-sectional views corresponding to a cross-section taken along lines A1-A1' and A2-A2' of FIG. 1. FIG. 3B shows cross-sectional views corresponding to a cross-section taken along lines B1-B1' and B2-B2' of FIG. 1. In FIGS. 3A and 3B, the same reference numerals are used to denote the same components as in FIGS. 1 to 2B.

Referring to FIGS. 3A and 3B, the first inner spacers 142S1 may be between a first semiconductor layer 140S1 and a first gate structure 120G1, and second inner spacers 142S2 may be between a second semiconductor layer 140S2 and a second gate structure 120G2. The first inner spacers 142S1 may be between the first semiconductor layer 140S1 and a first gate insulating layer GI1 in a plurality of first sub-gate portions 120S1. The second inner spacers 142S2 may be between the second semiconductor layer 140S2 and a second gate insulating layer GI2 in a plurality of second sub-gate portions 120S2.

For example, the first inner spacers 142S1 and the second inner spacers 142S2 may include silicon nitride or silicon oxynitride. In an exemplary manufacturing process, before the first semiconductor layer 140S1 and the second semiconductor layer 140S2 are formed, first recesses RS1 and second recesses RS2 may be formed. Portions of a sacrificial layer (refer to 210 in FIG. 7), which are exposed on inner walls of the first recesses RS1 and the second recesses RS2, may be removed in a lateral direction, so that the first inner spacers 142S1 and the second inner spacers 142S2 may be formed in spaces formed in the removed portions.

Although FIG. 3A illustrates an example in which a width of each of the first inner spacers 142S1 is equal to a width of each of the second inner spacers 142S2, the inventive concept is not limited thereto. In other example embodiments, the width of each of the first inner spacers 142S1 may be different from the width of each of the second inner spacers 142S2.

FIG. 3A illustrates an example in which sidewalls of the first inner spacers 142S1 and sidewalls of the second inner spacers 142S2 extend vertically, but the inventive concept is not limited thereto. In other example embodiments, the sidewall of each of the first inner spacers 142S1 may have a curved shape protruding in a direction toward a first semiconductor pattern NS1, and the sidewall of each of the second inner spacers 142S2 may have a curved shape protruding in a direction toward the second semiconductor pattern NS2. In other example embodiments, one of the first inner spacer 142S1 and the second inner spacer 142S2 may be omitted. For instance, only the second inner spacer 142S2 may be formed without forming the first inner spacer 142S1.

Figure 4B:
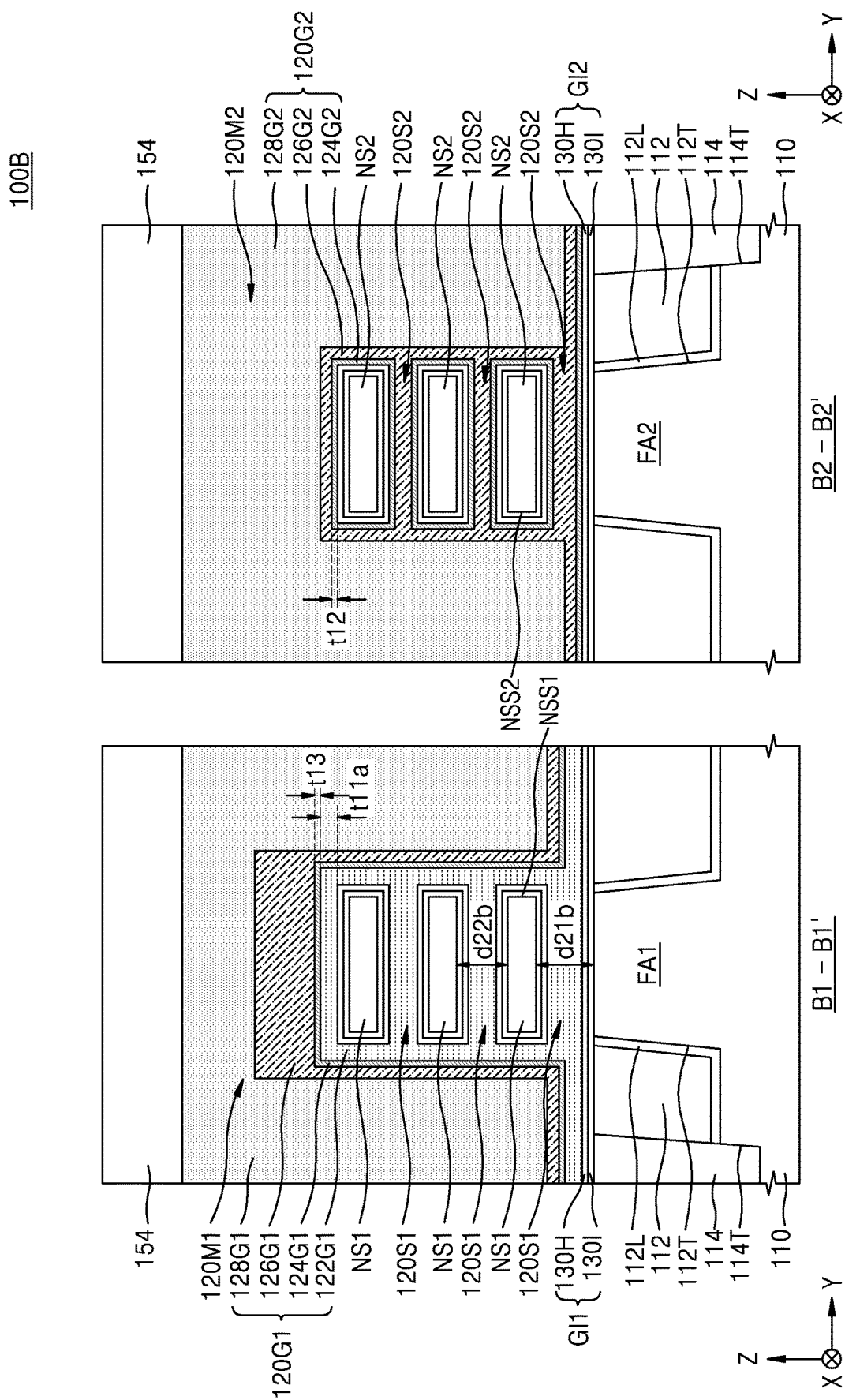

FIGS. 4A and 4B are cross-sectional views of an IC device 100B according to example embodiments. FIG. 4A shows cross-sectional views corresponding to a cross-section taken along the lines A1-A1' and A2-A2' of FIG. 1. FIG.

4B shows cross-sectional views corresponding to a cross-section taken along the lines B1-B1' and B2-B2' of FIG. 1. In FIGS. 4A and 4B, the same reference numerals are used to denote the same components as in FIGS. 1 to 3B.

Referring to FIGS. 4A and 4B, a first distance d21*b* between a lowermost first semiconductor pattern NS1 and a top surface of a first fin-type active region FA1 may be greater than a second distance d22*b* between a lowermost first semiconductor pattern NS1 and a first semiconductor pattern NS1 adjacent thereto.

A first material layer 122G1 may have a first thickness t11*a* on a top surface of an uppermost first semiconductor pattern NS1 or on a device isolation film 112. The first thickness t11*a* may range from about 1 nm to about 15 nm in some embodiments, but is not limited thereto. The first thickness t11*a* may be greater than one-half a thickness of a lowermost first sub-gate portion 120S1. The thickness of the lowermost first sub-gate portion 120S1 may correspond to a distance between a surface of a first gate insulating layer GI1 on the lowermost first semiconductor pattern NS1 and a surface of a first gate insulating layer GI1 on the first fin-type active region FA1. Thus, the first material layer 122G1 may fill each of a plurality of first sub-gate portions 120S1.

FIG. 4B illustrates a case in which the first distance d21*b* between the lowermost first semiconductor pattern NS1 and the top surface of the first fin-type active region FA1 is equal to a distance between a lowermost second semiconductor pattern NS2 and a top surface of a second fin-type active region FA2, but the inventive concept is not limited thereto. In other embodiments, the first distance d21*b* between the lowermost first semiconductor pattern NS1 and the top surface of the first fin-type active region FA1 may be different from the distance between the lowermost second semiconductor pattern NS2 and the top surface of the second fin-type active region FA2.

FIGS. 5A, 5B, 6A, 6B, 7, 8, 9A, 9B, 10A, 10B, 11A, 11B, 12A, 12B, 13A, 13B, 14A, 14B, 15A, 15B, 16A, 16B, 17A, and 17B are cross-sectional views illustrating a method of manufacturing an IC device, according to an example embodiment. FIGS. 5A, 6A, 7, 8, 9A, 10A, 11A, 12A, 13A, 14A, 15A, 16A, and 17A are cross-sectional views of a process sequence, which correspond to the cross-section taken along the lines A1-A1' and A2-A2' of FIG. 1. In contrast, FIGS. 5B, 6B, 9B, 10B, 11B, 12B, 13B, 14B, 15B, 16B, and 17B are cross-sectional views of a process sequence, which correspond to the cross-section taken along lines B1-B1' and B2-B2' of FIG. 1.

Figure 5B:
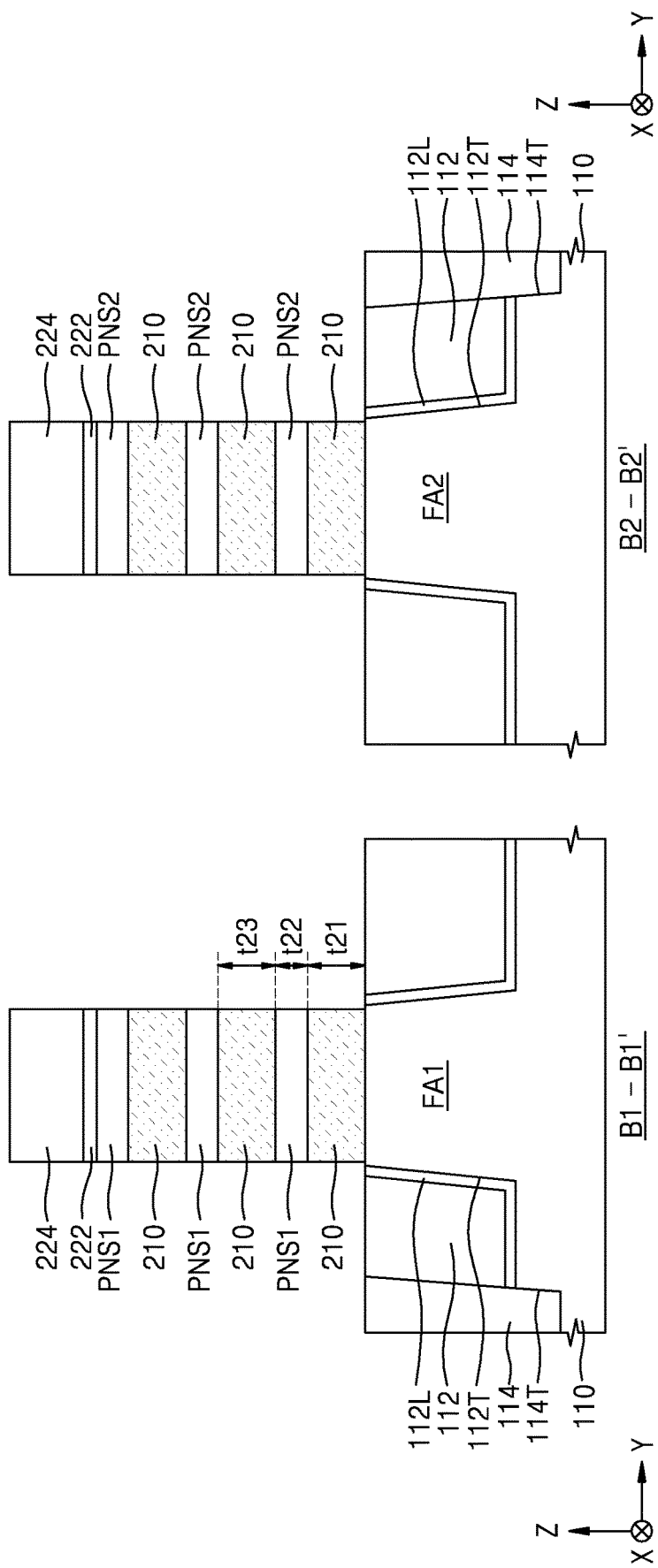

Referring now to FIGS. 5A and 5B, a sacrificial layer 210 and first and second channel semiconductor layers PNS1 and PNS2 may be alternately and sequentially formed on a top surface 110M of a substrate 110. The sacrificial layer 210 and the first and second channel semiconductor layers PNS1 and PNS2 may be formed using an epitaxy process.

The first channel semiconductor layer PNS1 may be formed on the substrate 110 in a region where the first transistor (refer to TR1 in FIG. 1) will be formed, and the second channel semiconductor layer PNS2 may be formed on the substrate 110 in a region where the second transistor (refer to TR2 in FIG. 1) will be formed. In some embodiments, the first channel semiconductor layer PNS1 and the second channel semiconductor layer PNS2 may be formed using the same process and connected to each other to form one material layer. In other embodiments, after the first channel semiconductor layer PNS1 is formed first, then the second channel semiconductor layer PNS2 may be formed.

In example embodiments, the sacrificial layer 210 and the first and second channel semiconductor layers PNS1 and PNS2 may include materials having an etch selectivity with respect to each other. For example, each of the sacrificial layer 210 and the first and second channel semiconductor layers PNS1 and PNS2 may include a single crystalline layer of a Group IV semiconductor, a Group IV-IV compound semiconductor, or a Group III-V compound semiconductor. The sacrificial layer 210 and the first and second channel semiconductor layers PNS1 and PNS2 may include different materials. In an example embodiment, the sacrificial layer 210 may include silicon germanium, and the first and second channel semiconductor layers PNS1 and PNS2 may include single crystalline silicon.

In other example embodiments, the epitaxy process may include a vapor-phase epitaxy (VPE) process, a CVD process such as an ultra-high vacuum chemical vapor deposition (UHV-CVD), a molecular beam epitaxy (MBE) process, or a combination thereof. During the epitaxy process, a liquid precursor or gaseous precursor may be used as a precursor required for forming the sacrificial layer 210 and the first and second channel semiconductor layers PNS1 and PNS2.

As shown in FIG. 5B, a lowermost sacrificial layer 210 may have a first thickness t21, a lowermost first channel semiconductor layer PNS1 may have a second thickness t22, and the sacrificial layer 210 located on the lowermost first channel semiconductor layer PNS1 may have a third thickness t23. In example embodiments, the first thickness t21 may be equal to the third thickness t23, and the second thickness t22 may be less than the first thickness t21. However, the inventive concept is not limited thereto. Unlike that shown in FIG. 5B, the second thickness t22 may be equal to the first thickness t21. In other embodiments, the first thickness t21 may be greater than the third thickness t23. In this case, the IC device 100B described with reference to FIGS. 4A and 4B may be manufactured.

Afterwards, a lower layer 222 and a hard mask pattern 224, which extend by predetermined lengths in a first direction (X direction), may be formed on the first and second channel semiconductor layers PNS1 and PNS2. The sacrificial layer 210, the first and second channel semiconductor layers PNS1 and PNS2, and the substrate 110 may be etched using the lower layer 222 and the hard mask pattern 224 as an etch mask, thereby forming a sacrificial layer pattern (not shown) and a device isolation trench 112T.

Thereafter, a device isolation liner 112L may be conformally formed inside the device isolation trench 112T. The inside of the device isolation trench 112T may be filled with a device isolation film 112 on the device isolation liner 112L, and an upper portion of the device isolation film 112 may be planarized. Portions of the device isolation film 112 and the substrate 110 may be etched to form a deep trench 114T defining a device region (DR), and a deep trench insulating film 114 may be formed inside the deep trench 114T.

Subsequently, the lower layer 222 and the hard mask pattern 224, which remain on the sacrificial layer pattern, may be removed, and a recess process may be performed to remove upper portions of the device isolation film 112 and the deep trench insulating film 114 by a partial thickness.

Referring to FIGS. 6A and 6B, a dummy gate structure DG may be formed on the sacrificial layer pattern and the device isolation film 112. Each of the dummy gate structures DG may include a dummy gate insulating layer 232, a dummy gate line 234, a dummy gate capping layer 236, and gate spacers 132. For example, the dummy gate line 234 may include polysilicon, and the dummy gate capping layer 236 may include a silicon nitride film. The dummy gate insulating layer 232 may include a material having an etch selectivity with respect to the dummy gate line 234. For example, the dummy gate insulating layer 232 may include a film including at least one of a thermal oxide, silicon oxide, and silicon nitride. The gate spacers 132 may include silicon oxide, silicon oxynitride, or silicon nitride, but are not limited thereto.

Figure 7:
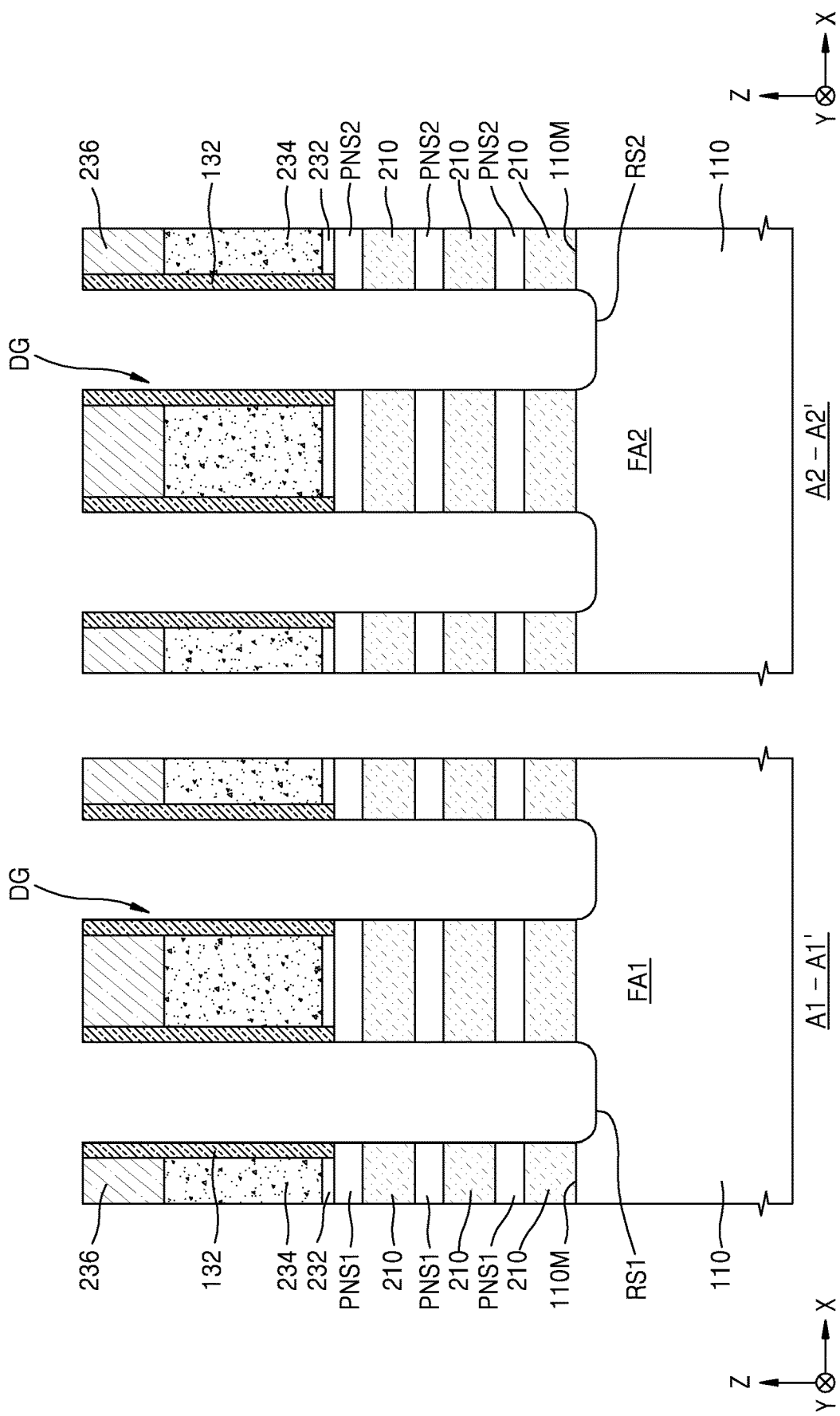

Referring to FIG. 7, portions of the sacrificial layer pattern and the substrate 110 on both sides of the dummy gate structures DG may be etched to form first recesses RS1 and second recesses RS2 on both sides of the dummy gate structure DG. Sidewalls of the sacrificial layer 210 and the first and second channel semiconductor layers PNS1 and PNS2 may be exposed at inner walls of the first recesses RS1 and the second recesses RS2.

Optionally, portions of the sacrificial layer 210, which are exposed at the inner walls of the first recess RS1 and the second recess RS2, may be removed in a lateral direction by using an isotropic etching process, thereby forming recess regions (not shown). For example, the process of removing the portions of the sacrificial layer 210 may include a wet etching process, and the sacrificial layer 210 including SiGe may be etched faster than the first and second channel semiconductor layers PNS1 and PNS2 that include, for example, silicon. Thus, the recess regions may be formed. Subsequently, an insulating layer (not shown) may be formed on the inner walls of the first recess RS1 and the second recess RS2 to fill the recess regions. By leaving only portions of the insulating layer, which are in the recess regions, and removing the remaining unnecessary insulating layer, inner spacers 142S1 and 142S2 may be formed. In this case, the IC device 100A described with reference to FIGS. 3A and 3B may be manufactured.

Referring to FIG. 8, a first semiconductors layer 140S1 and a second semiconductor layer 140S2 may be formed inside the first recess RS1 and the second recess RS2, respectively. For example, the first semiconductor layer 140S1 may be formed by epitaxially growing a semiconductor material from surfaces of the first channel semiconductor layer PNS1 and the substrate 110, which are exposed at the inner wall of the first recess RS1.

Moreover, FIGS. 7 and 8 exemplarily illustrate a method in which after the first recess RS1 and the second recess RS2 are simultaneously formed on the first fin-type active region FA1 and the second fin-type active region FA2, the first semiconductor layer 140S1 and the second semiconductor layer 140S2 are simultaneously formed. However, for example, when the first fin-type active region FA1 is a PMOS transistor forming region and the second fin-type active region FA2 is an NMOS transistor forming region, a protective film (not shown) may be formed on the second fin-type active region FA2, and the first recess RS1 and the first semiconductor layer 140S1 may be then formed. Thereafter, a protective film (not shown) may be formed on the first fin-type active region FA1, and the second recess RS2 and the second semiconductor layer 140S2 may be then formed. In this case, a material included in the first semiconductor layer 140S1 may be different from a material included in the second the semiconductor layer 140S2. Thereafter, an inter-gate dielectric layer 152 may be formed on sidewalls of the dummy gate structure DG, the first semiconductor layer 140S1, and the second semiconductor layer 140S2.

Referring to FIGS. 9A and 9B, upper portions of the dummy gate structure DG and the inter-gate dielectric layer 152 may be planarized to remove the dummy gate capping layer (refer to 236 in FIG. 8) of the dummy gate structure DG and expose a top surface of the dummy gate line 234.

Subsequently, the dummy gate line 234 and the dummy gate insulating layer 232, which are exposed by the inter-gate dielectric layer 152, may be removed to define a gate space GS. During the removal process, the gate spacers 132 may remain, and the gate space GS may be defined by both sidewalls of the gate spacers 132.

Figure 10B:
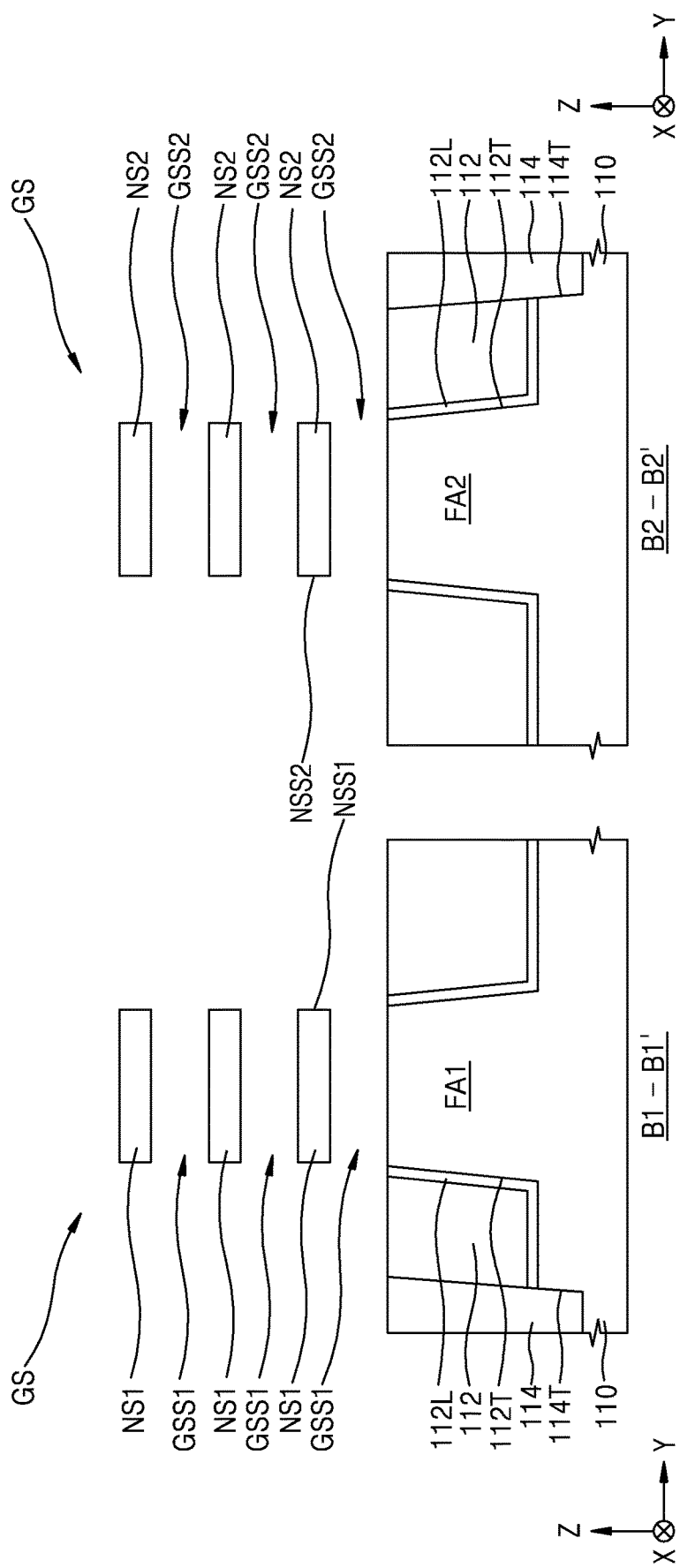

Referring to FIGS. 10A and 10B, a plurality of sacrificial layers 210, which remain on the first and second fin-type active regions FA1 and FA2, may be removed through the gate space GS. Accordingly, top surfaces of the first and second channel semiconductor layers PNS1 and PNS2 and the first and second fin-type active regions FA1 and FA2 may be partially exposed through the gate space GS.

The first channel semiconductor layer PNS1 remaining on the first fin-type active region FA1 may be referred to as a plurality of first semiconductor patterns NS1, while the second channel semiconductor layer PNS2 remaining on the second fin-type active region FA2 may be referred to as a plurality of second semiconductor patterns NS2. A first sub-gate space GSS1 may be formed between the plurality of first semiconductor patterns NS1, and a second sub-gate space GSS2 may be formed between the plurality of second semiconductor patterns NS2. The removal of the plurality of sacrificial layers 210 may be performed using a wet etching process using a difference in etch rate between the sacrificial layer 210 and the first and second channel semiconductor layers PNS1 and PNS2.

Figure 11B:
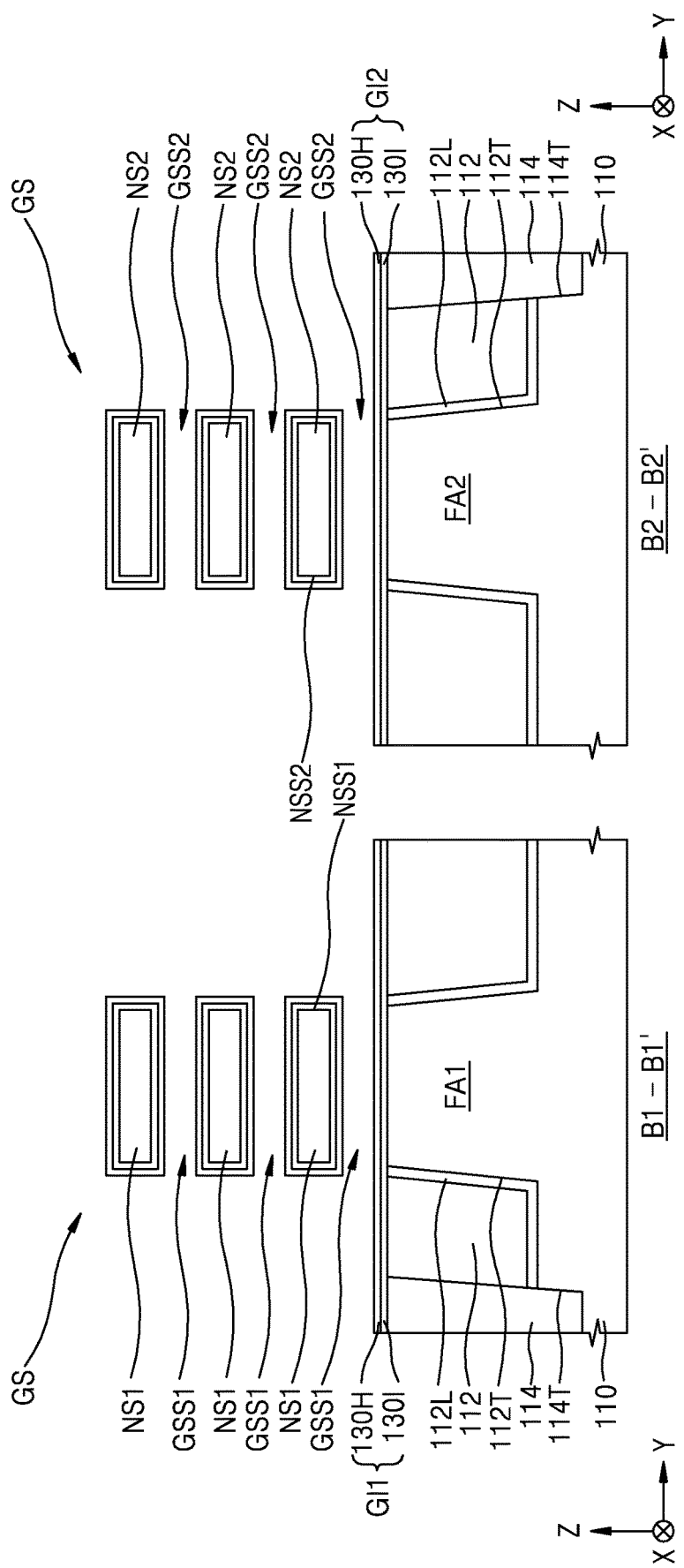

Referring to FIGS. 11A and 11B, first and second gate insulating layers GI1 and GI2 may be formed on exposed surfaces of the gate space GS and the first and second sub-gate spaces GSS1 and GSS2. The first gate insulating layer GI1 may be formed to surround sidewalls NSS1 of the plurality of first semiconductor patterns NS1, and also formed on the top surface of the first fin-type active region FA1 and on the device isolation film 112 and the deep trench insulating film 114. The second gate insulating layer GI2 may be formed to surround sidewalls NSS2 of the plurality of second semiconductor patterns NS2, and also formed on the top surface of the second fin-type active region FA2 and on the device isolation film 112 and the deep trench insulating film 114.

Referring to FIGS. 12A and 12B, a first material layer 122G1 may be conformally formed on the first and second gate insulating layers GI1 and GI2. The first material layer 122G1 may be formed not only on the first fin-type active region FA1 and the second fin-type active region FA2, but also on the device isolation film 112 and the deep trench insulating film 114. In example embodiments, the first material layer 122G1 may completely fill the first sub-gate space GSS1 between the plurality of first semiconductor patterns NS1 and may completely fill the second sub-gate space GSS2 between the plurality of second semiconductor patterns NS2.

In example embodiments, the first material layer 122G1 may include at least one of a metal nitride including a first metal, a metal carbide including the first metal, and a metal carbonitride including the first metal, and the first metal may include at least one of titanium, tantalum, niobium, molybdenum, and tungsten.

Figure 13A:
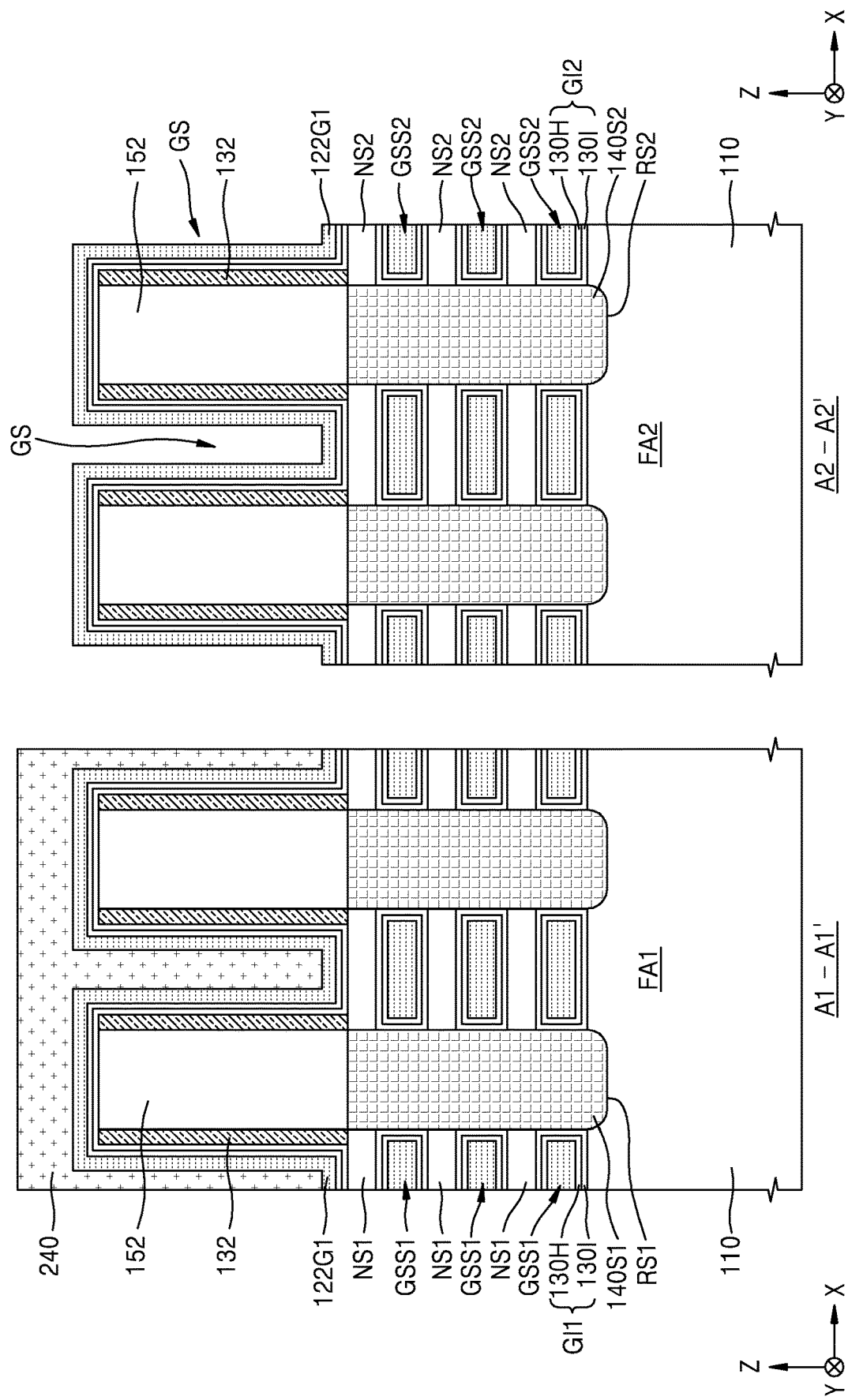

Referring to FIGS. 13A and 13B, a mask material layer may be formed on the first material layer 122G1 to fill the gate space GS, and a mask pattern may be formed on the mask material layer to overlap the first fin-type active region FA1. The mask material layer may be etched using the mask pattern, thereby forming a mask layer 240. The mask layer 240 may cover the plurality of first semiconductor patterns NS1 and the first fin-type active region FA1. Moreover, since the first sub-gate space GSS1 between the plurality of first semiconductor patterns NS1 is filled with the first material layer 122G1, the first sub-gate space GSS1 may not be filled with a material included in the mask layer 240.

In example embodiments, the mask layer 240 may include a carbon-based insulating material. For example, the mask layer 240 may include a material having a relatively high carbon content, such as SiC:H, SiCN, SiCN:H, SiOCN, SiOCN:H, silicon oxycarbide (SiOC), a spin-on hardmask (SOH), a silicon-containing anti-reflective coating (ARC) layer, spin-on glass (SOG), an advanced planarization layer (APL), and/or an organic dielectric layer (ODL), but is not limited thereto.

Figure 14A:
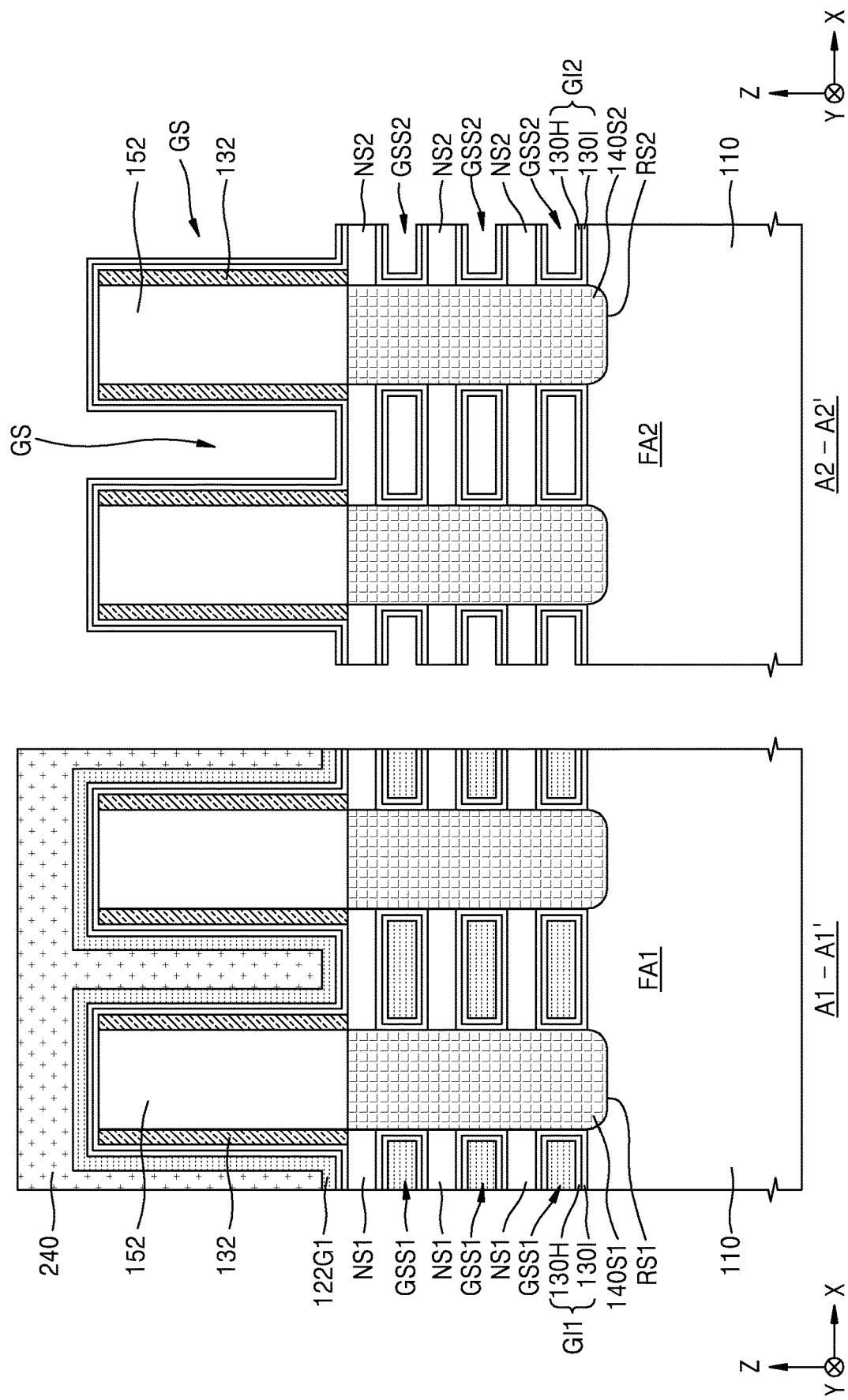
Figure 14B:
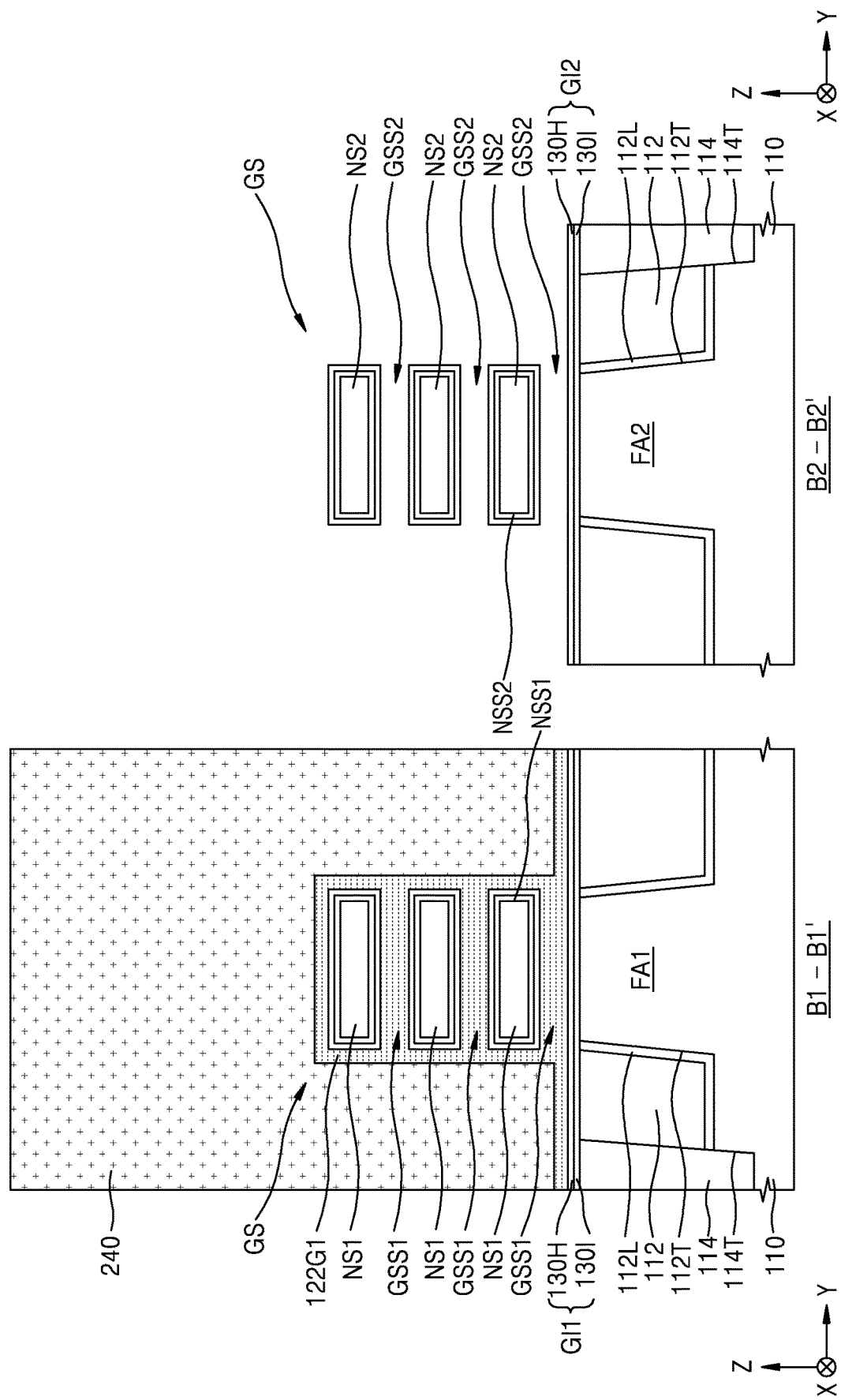

Referring to FIGS. 14A and 14B, the first material layer 122G1, which is exposed on the second fin-type active region FA2, the device isolation film 112, and the deep trench insulating film 114, may be removed using the mask layer 240 as an etch mask. In example embodiments, the removal of the first material layer 122G1 using the mask layer 240 may be performed using a wet etching process. During the wet etching process, the first material layer 122G1, which is located on sidewalls of the gate space GS and in the plurality of second sub-gate spaces GSS2, may be removed.

Figure 15A:
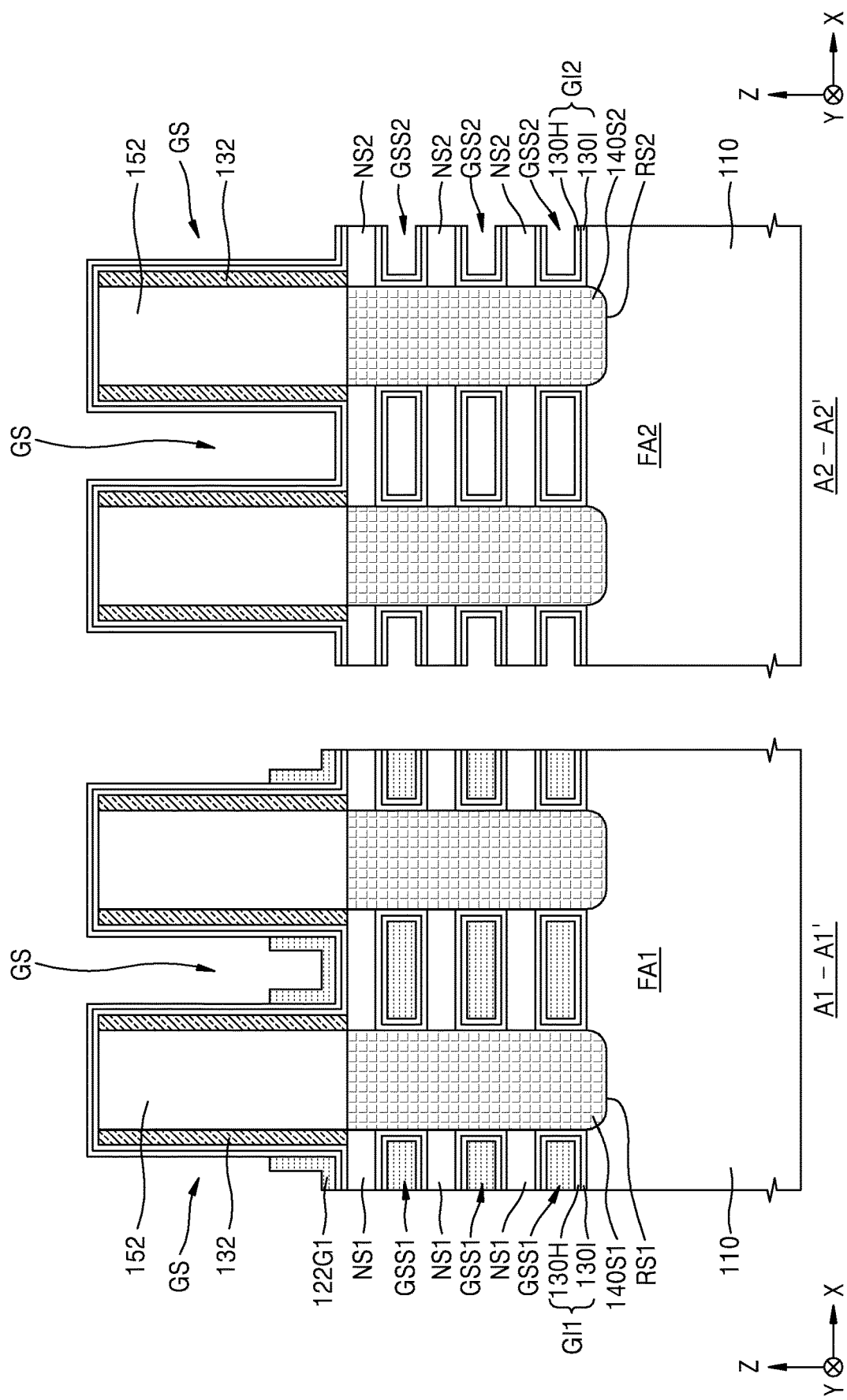
Figure 15B:
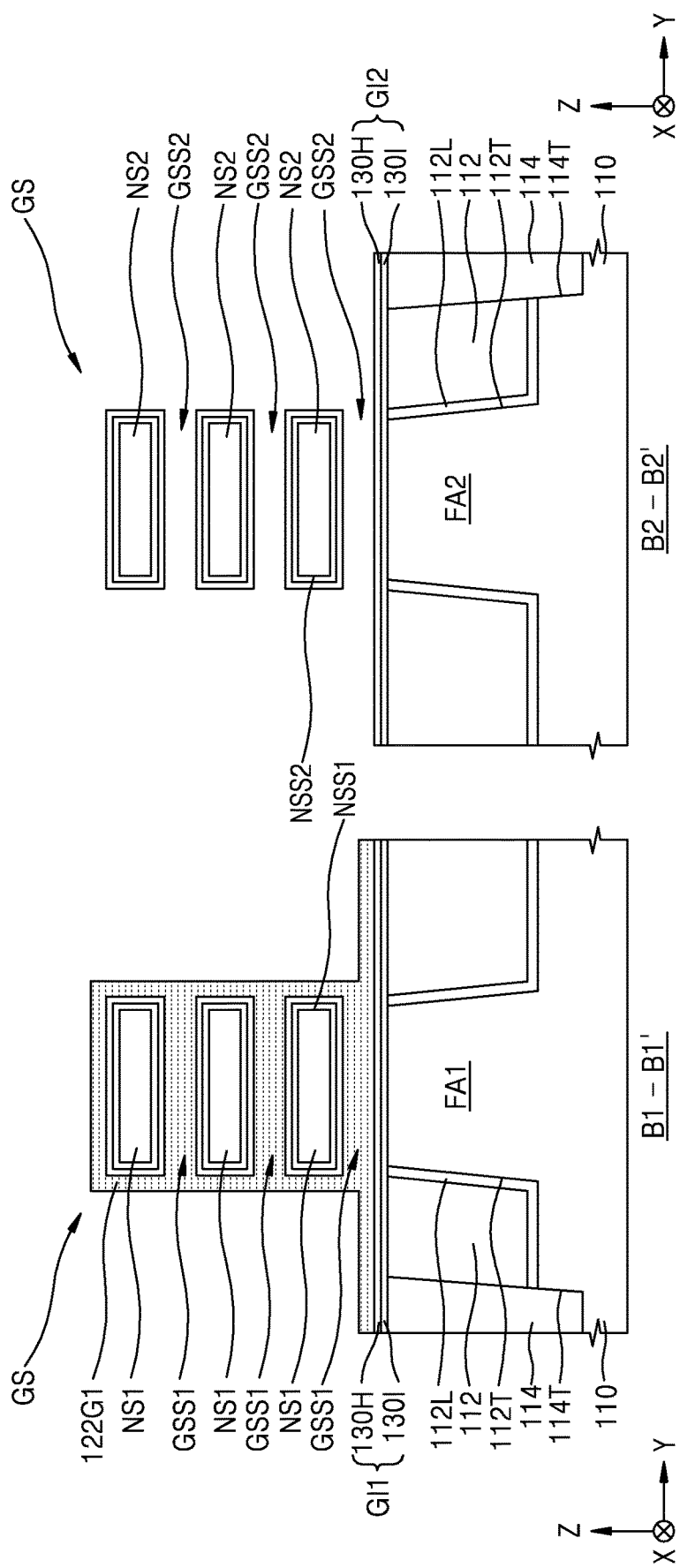

Referring to FIGS. 15A and 15B, the mask layer (refer to 240 in FIG. 14A) may be removed. Subsequently, an upper portion of the first material layer 122G1 located in the gate space GS on the first fin-type active region FA1 may be partially removed using an etchback process. The first material layer 122G1 may have a top surface at a lower level than top surfaces of the inter-gate dielectric layer 152 and the gate spacers 132. Moreover, during the etchback process, portions of the first material layer 122G1, which are located in the plurality of first sub-gate spaces GSS1, may not be damaged or removed.

Figure 16A:
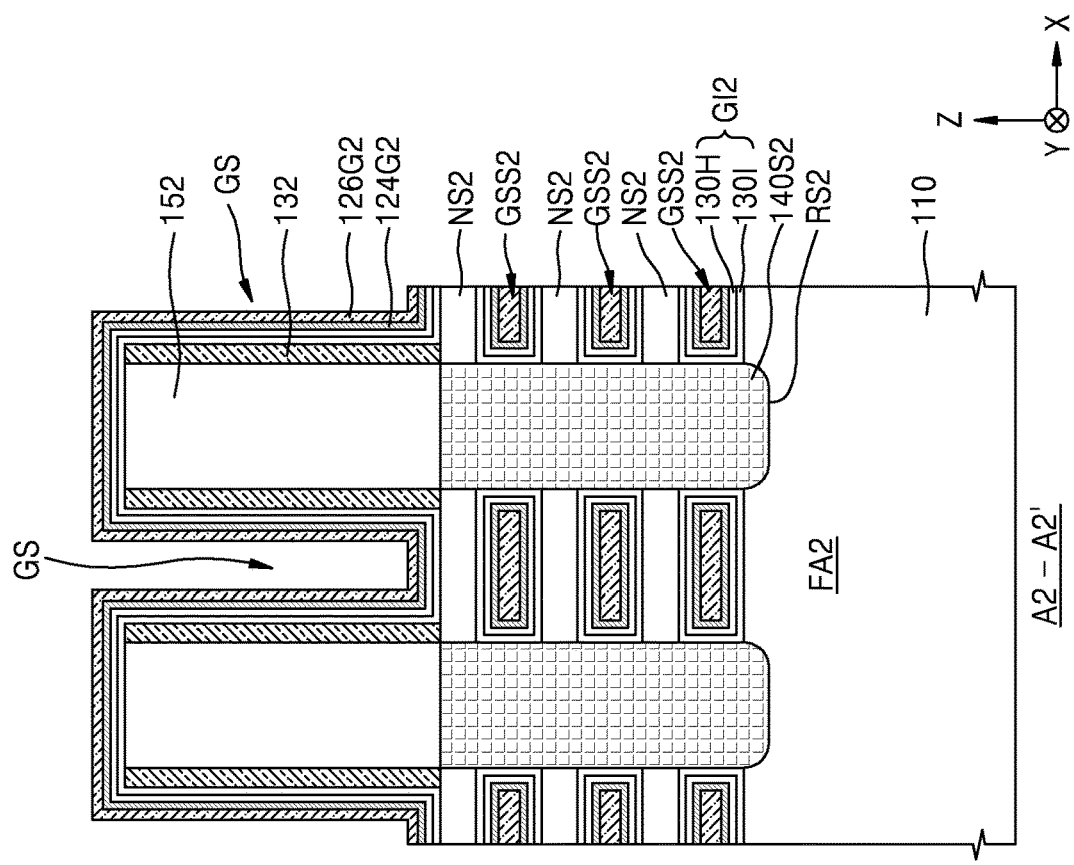
Figure 16B:
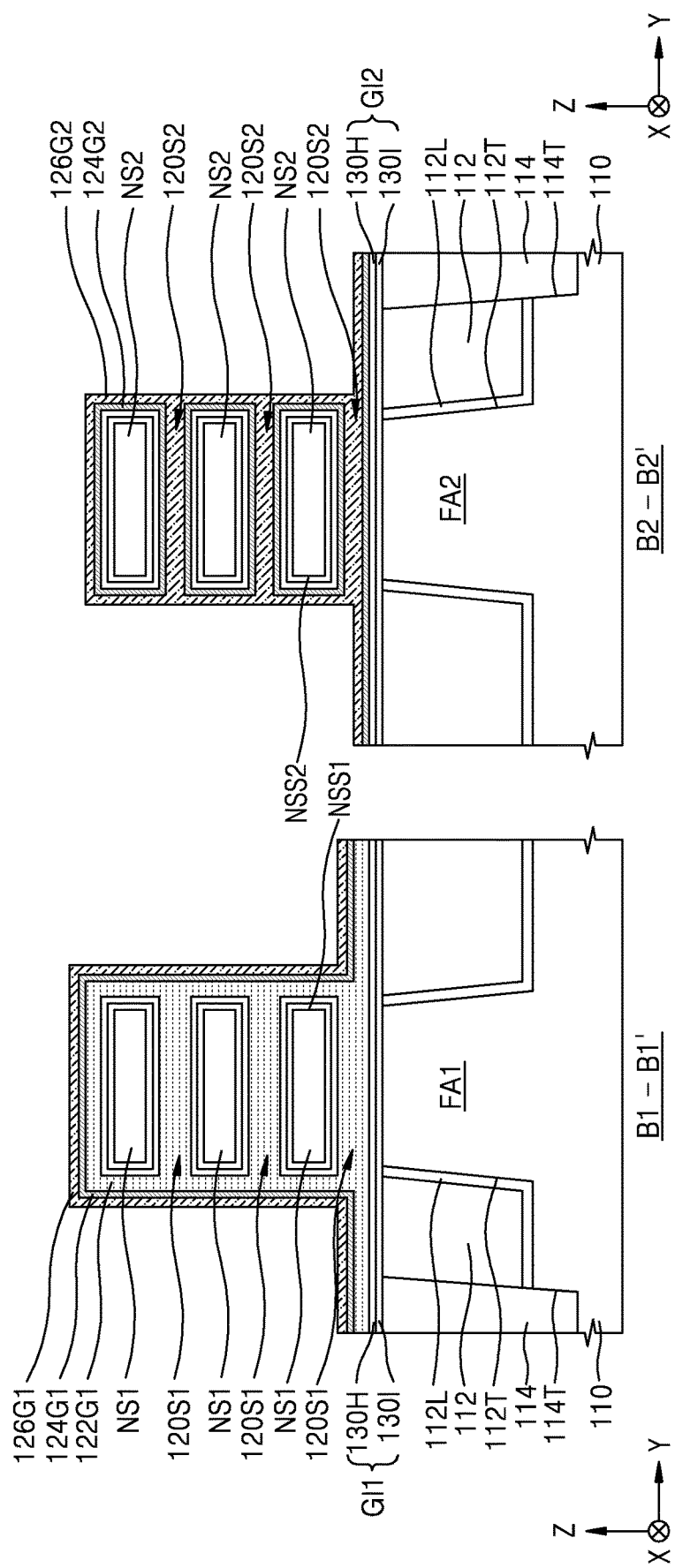
Figure 17B:
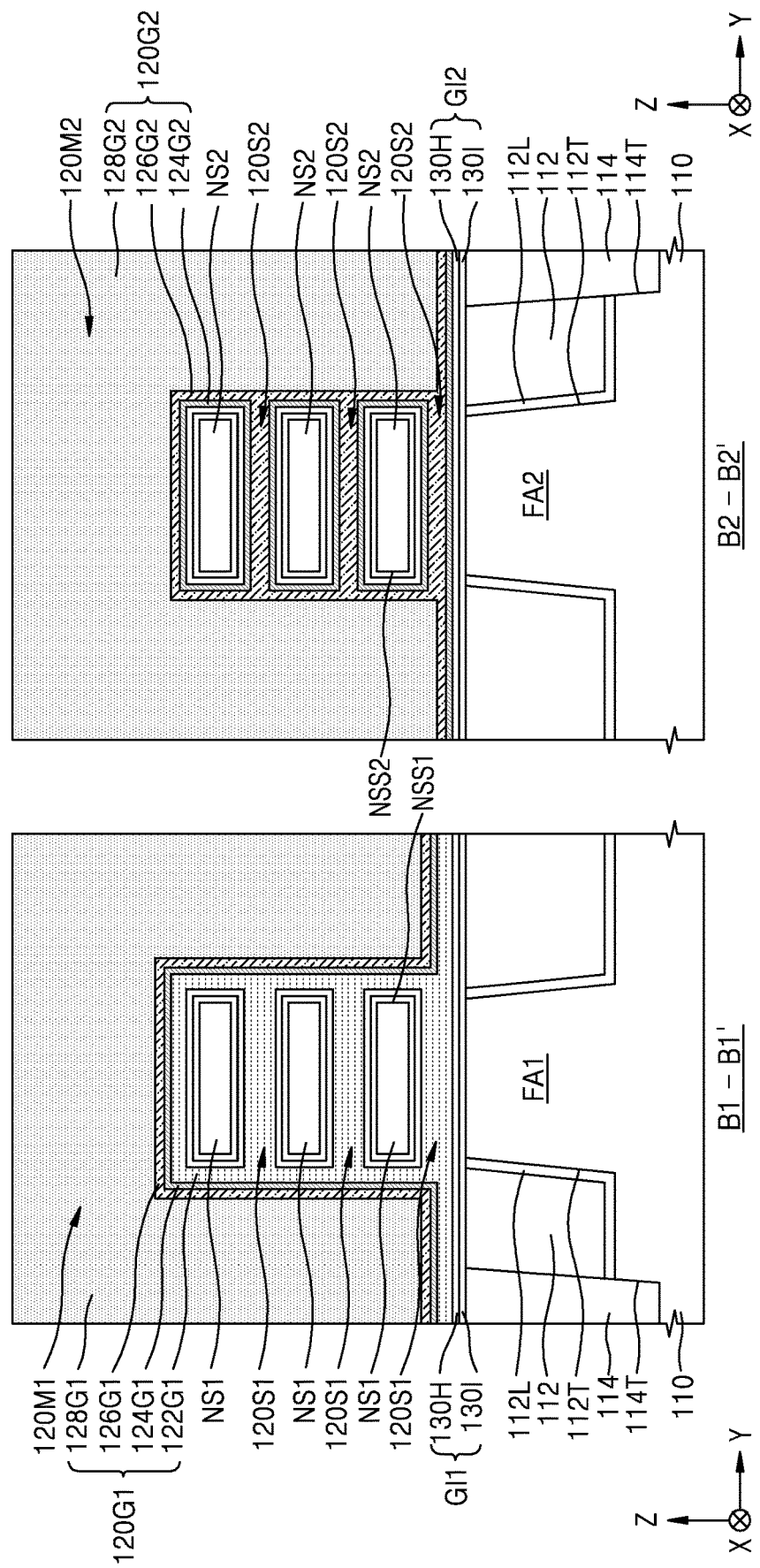

Referring to FIGS. 16A and 16B, a second material layer 124G2 may be formed on the plurality of second semiconductor patterns NS2 located on the second fin-type active region FA2, and a fourth material layer 124G1 may be formed on the first material layer 122G1 located on the first fin-type active region FA1.

In example embodiments, the second material layer 124G2 and the fourth material layer 124G1 may include at least one of a metal oxide including a second metal, a metal oxynitride including the second metal, a metal oxycarbide including the second metal, and a metal oxycarbonitride including the second metal. The second metal may include at least one of titanium, tantalum, niobium, molybdenum, and tungsten. In some examples, the second material layer 124G2 may be expressed by the following formula: $M_xO_yN_z$, where M is the second metal, O is oxygen, N is nitrogen, $0.2 \leq y \leq 0.7$, $0.3 \leq x+z \leq 0.8$, and $0 \leq z \leq 0.5$.

In example embodiments, the process of forming the second material layer 124G2 and the fourth material layer 124G1 may be performed in an oxygen-containing atmosphere or using a formation process using oxygen as a reactant. In other embodiments, to form the second material layer 124G2 and the fourth material layer 124G1, a preliminary material layer may be firstly formed in an oxygen-free atmosphere, and an oxidation process (or a process of exposing the preliminary material layer to an oxygen-containing atmosphere) may be subsequently performed. In still other embodiments, the process of forming the second material layer 124G2 and the fourth material layer 124G1 may be performed in an oxygen-containing atmosphere or using a formation process using oxygen as a reactant, and may be subsequently followed by a process of further exposing formed material layers to an oxygen-containing atmosphere.

The fourth material layer 124G1 may not be formed inside the plurality of first sub-gate spaces GSS1 but be located on the first material layer 122G1 in the gate space GS1. Also, during the process of forming the second material layer 124G2 and the fourth material layer 124G1, the first material layer 122G1 located in the first sub-gate space GSS1 may not be oxidized or damaged. Thus, the second material layer 124G2 and the fourth material layer 124G1 may contain oxygen at relatively high contents, while the first material layer 122G1 may not substantially contain oxygen.

Afterwards, a third material layer 126G2 and a fifth material layer 126G1 may be formed on the second material layer 124G2 and the fourth material layer 124G1, respectively. The third material layer 126G2 and the fifth material layer 126G1 may include aluminum, copper, titanium, tantalum, tungsten, molybdenum, tantalum nitride, nickel silicide, cobalt silicide, titanium nitride, tungsten nitride, titanium aluminide, titanium aluminum carbide, titanium aluminum nitride, tantalum carbonitride, tantalum carbide, tantalum silicon nitride, or a combination thereof, but are not limited thereto.

Referring back to FIGS. 2A and 2B, a first buried conductive layer 128G1 and a second buried conductive layer 128G2 may be formed on the fifth material layer 126G1 and the third material layer 126G2 to fill the gate space GS. Upper portions of the first buried conductive layer 128G1 and the second buried conductive layer 128G2 may be planarized so that a top surface of the inter-gate dielectric layer 152 is exposed. Thus, a first gate structure 120G1 and a second gate structure 120G2 may be formed.

According to the above-described method of manufacturing the IC device 100, the first material layer 122G1 may be formed to fill the first sub-gate space GSS1 and the second sub-gate space GSS2, and the first material layer 122G1 may be removed from the second sub-gate space GSS2. Subsequently, the fourth material layer 124G1 and the second material layer 124G2 may be formed using a material having a relatively high oxygen content on the first material layer 122G1 and in the second sub-gate space GSS2. During the formation of the second material layer 124G2 having a relatively high oxygen content, the first material layer 122G1 located in the plurality of first sub-gate portions 120S1 may be prevented from being undesirably oxidized. Thus, advantageously, the second transistor TR2 may have a reduced leakage current and more precise control of a threshold voltage of each of the first transistor TR1 and the second transistor TR2 may be achieved. Accordingly, the IC device 100 may have improved performance.

While the inventive concept has been particularly shown and described with reference to embodiments thereof, it will be understood that various changes in form and details may be made therein without departing from the spirit and scope of the following claims.

What is claimed is:

1. An integrated circuit device comprising:
   first and second fin-type semiconductor active regions on a substrate;
   a plurality of first semiconductor patterns, which are stacked on the first fin-type active region as a first plurality of spaced-apart channel regions of a first FINFET having a first threshold voltage;
   a plurality of second semiconductor patterns, which are stacked on the second fin-type active region as a second plurality of spaced-apart channel regions of a second FINFET having a second threshold voltage different from the first threshold voltage;

a first gate structure on the plurality of first semiconductor patterns, said first gate structure comprising a first electrically conductive material region, which at least partially fills spaces between the first plurality of spaced-apart channel regions and wraps around each of the first plurality of spaced-apart channel regions; and a second gate structure on the plurality of second semiconductor patterns, said second gate structure comprising second and third electrically conductive material regions, which at least partially fill spaces between the second plurality of spaced-apart channel regions;

wherein the second electrically conductive material region wraps around each of the second plurality of spaced-apart channel regions;

wherein the third electrically conductive material region wraps around each of the second plurality of spaced-apart channel regions, and around the second electrically conductive material region;

wherein a work function of the third electrically conductive material region is less than a work function of the first electrically conductive material region and less than a work function of the second electrically conductive material region; and wherein a percentage of oxygen content in the second electrically conductive material region exceeds a percentage of oxygen content in the first electrically conductive material region.

2. The device of claim 1, wherein the first electrically conductive material region extends on sidewalls of the plurality of first semiconductor patterns and on a top surface of an uppermost one of the plurality of first semiconductor patterns; and wherein the first gate structure further includes a composite of a fourth material region and a fifth material region, which extend on sidewalls and on a top surface of the first electrically conductive material region.

3. The device of claim 2, wherein a percentage of oxygen content in the fourth material region exceeds a percentage of oxygen content in the first electrically conductive material region.

4. The device of claim 1, wherein the first electrically conductive material region comprises at least one of a metal nitride including a first metal, a metal carbide including the first metal and a metal carbonitride including the first metal; and where the second electrically conductive material region comprises at least one of a metal oxide including a second metal, a metal oxynitride including the second metal, a metal oxycarbide including the second metal, and a metal oxycarbonitride including the second metal.

5. The device of claim 4, wherein the first metal is selected from a group consisting of titanium, niobium, tantalum, molybdenum and tungsten; and wherein the second metal is selected from a group consisting of titanium, niobium, tantalum, molybdenum and tungsten.

6. The device of claim 4, wherein the second electrically conductive material region comprises $M_xO_yN_z$, where M is a metal, O is oxygen and N is nitrogen, $x>0.0$, $z>0.0$, $0.2 \leq y \leq 0.7$ and $0.3 \leq x+z \leq 0.8$.

7. The device of claim 1, wherein the first electrically conductive material region is electrically insulated from the plurality of first semiconductor patterns; and wherein the second electrically conductive material region is electrically insulated from the plurality of second semiconductor patterns.

8. An integrated circuit device comprising:

first and second fin-type semiconductor active regions on a substrate;

a plurality of first semiconductor patterns, which are stacked on the first fin-type active region as a first plurality of spaced-apart channel regions of a first FINFET;

a plurality of second semiconductor patterns, which are stacked on the second fin-type active region as a second plurality of spaced-apart channel regions of a second FINFET;

a first gate structure on the plurality of first semiconductor patterns, said first gate structure comprising a first material region, which surrounds and at least partially fills spaces between the first plurality of spaced-apart channel regions; and a second gate structure on the plurality of second semiconductor patterns, said second gate structure comprising a second material region, which surrounds and at least partially fill spaces between the second plurality of spaced-apart channel regions, and a third material region, which surrounds the second material region, said third material region having a lower work function relative to the second material region; and wherein a percentage of oxygen content in the second material region exceeds a percentage of oxygen content in the first material region.

9. The device of claim 8, wherein the second material region comprises $M_xO_yN_z$, where M is a metal, O is oxygen and N is nitrogen, $x>0.0$, $z>0.0$, $0.2 \leq y \leq 0.7$ and $0.3 \leq x+z \leq 0.8$.

10. An integrated circuit device comprising:

a first fin-type active region and a second fin-type active region protruding from a substrate and extending in a first direction;

a plurality of first semiconductor patterns located apart from a top surface of the first fin-type active region, each first semiconductor pattern having a channel region;

a plurality of second semiconductor patterns located apart from a top surface of the second fin-type active region, each second semiconductor pattern having a channel region;

a first gate structure extending in a second direction on the first fin-type active region and comprising a first material layer filling a first sub-gate space between the respective first semiconductor patterns, wherein the second direction is perpendicular to the first direction; and a second gate structure extending in the second direction on the second fin-type active region and comprising a second material layer and a third material layer sequentially located in a second sub-gate space between the respective second semiconductor patterns;

wherein the third material layer surrounds the second material layer and has a lower work function relative to the first and second material layers; and wherein a material included in the second material layer has a higher oxygen content than a material included in the first material layer.

11. The integrated circuit device of claim 10, wherein the first material layer is located on sidewalls of the plurality of first semiconductor patterns located in the second direction and a top surface of an uppermost first semiconductor pattern, wherein the first gate structure comprises:
- a fourth material layer located on the first material layer and surrounding the sidewalls of the plurality of first semiconductor patterns located in the second direction; and
- a fifth material layer located on the fourth material layer and surrounding the sidewalls of the plurality of first semiconductor patterns located in the second direction.

12. The integrated circuit device of claim 11, wherein a material included in the fourth material layer has a higher oxygen content than a material included in the first material layer.

13. The integrated circuit device of claim 11, wherein the first material layer has a first thickness, and the second material layer has a second thickness that is less than the first thickness,
- the second thickness is about 2 nm or less, and
- a thickness of the fourth material layer is equal to the second thickness of the second material layer.

14. The integrated circuit device of claim 11, wherein the first gate structure further comprises a first buried conductive layer surrounding the fifth material layer,
- the second material layer is located on sidewalls of the plurality of second semiconductor patterns located in the second direction and a top surface of an uppermost second semiconductor pattern, and
- the second gate structure further comprises a second buried conductive layer surrounding the third material layer.

15. The integrated circuit device of claim 10, wherein the first material layer comprises at least one of a metal nitride including a first metal, a metal carbide including the first metal, and a metal carbonitride including the first metal, and
- the second material layer comprises at least one of a metal oxide including a second metal, a metal oxynitride including the second metal, a metal oxycarbide including the second metal, and a metal oxycarbonitride including the second metal.

16. The integrated circuit device of claim 15, wherein the first metal comprises at least one of titanium, tantalum, niobium, molybdenum, and tungsten, and
- the second metal comprises at least one of titanium, tantalum, niobium, molybdenum, and tungsten.

17. The integrated circuit device of claim 15, wherein the second material layer is expressed by formula $M_xO_yN_z$,
- wherein M is the second metal, $0.2 \leq y \leq 0.7$, and $0.3 \leq x+z \leq 0.8$.

18. The integrated circuit device of claim 10, further comprising:
- a first gate insulating layer between the plurality of first semiconductor patterns and the first material layer; and
- a second gate insulating layer between the plurality of second semiconductor patterns and the second material layer.

* * * * *